US012660194B2

(12) United States Patent
Noh et al.

(10) Patent No.: US 12,660,194 B2
(45) Date of Patent: Jun. 16, 2026

(54) SEMICONDUCTOR DEVICE

(71) Applicant: Samsung Electronics Co., Ltd.,
Suwon-si (KR)

(72) Inventors: Young Ji Noh, Suwon-si (KR); Jong Ho Woo, Suwon-si (KR); Min Jun Lee, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 432 days.

(21) Appl. No.: 18/341,201

(22) Filed: Jun. 26, 2023

(65) Prior Publication Data

US 2024/0081079 A1     Mar. 7, 2024

(30) Foreign Application Priority Data

Sep. 2, 2022     (KR) ........................ 10-2022-0111331

(51) Int. Cl.
| | |
|---|---|
| *H10B 51/20* | (2023.01) |
| *H01L 23/522* | (2006.01) |
| *H01L 23/528* | (2006.01) |
| *H10B 51/10* | (2023.01) |
| *H10B 51/30* | (2023.01) |
| *H10D 30/69* | (2025.01) |

(52) U.S. Cl.
CPC ......... *H10B 51/20* (2023.02); *H01L 23/5226* (2013.01); *H01L 23/5283* (2013.01); *H10B 51/10* (2023.02); *H10B 51/30* (2023.02); *H10D 30/701* (2025.01)

(58) Field of Classification Search
CPC ........ H10B 51/10; H10B 51/20; H10B 51/30; H10D 30/701; H01L 23/5226; H01L 23/5283

See application file for complete search history.

(56) References Cited

U.S. PATENT DOCUMENTS

| | | | |
|---|---|---|---|
| 10,651,182 B2 | 5/2020 | Morris et al. | |
| 10,790,288 B2 | 9/2020 | Juengling | |
| 11,057,183 B2 | 7/2021 | Son et al. | |
| 11,133,329 B2 | 9/2021 | Lue | |

(Continued)

FOREIGN PATENT DOCUMENTS

| | | | | |
|---|---|---|---|---|
| CN | 111758161 A | * | 10/2020 | ............. H01L 25/50 |
| KR | 20210050772 A | * | 5/2021 | ....... H01L 21/76831 |
| KR | 20240073676 A | * | 5/2024 | ............. H10B 41/50 |

*Primary Examiner* — Matthew E Warren
(74) *Attorney, Agent, or Firm* — Harness, Dickey & Pierce, P.L.C.

(57) ABSTRACT

Provided is a semiconductor device. The semiconductor device includes a substrate; a first interlayer insulating layer, on the substrate, comprising a first interconnection; a common source plate on the first interlayer insulating layer; a conductive layer extending in a first direction on the common source plate; a ferroelectric layer on one sidewall of the conductive layer; a channel layer on the ferroelectric layer; a first conductive pillar, on the channel layer, penetrating the common source plate and being connected to the first interconnection; and a second conductive pillar, on the channel layer, spaced apart from the first conductive pillar in the first direction and connected to the common source plate, the ferroelectric layer and the channel layer between the common source plate and the first conductive pillar.

20 Claims, 31 Drawing Sheets

(56) References Cited

U.S. PATENT DOCUMENTS

| | | | |
|---|---|---|---|
| 11,251,199 B2 | 2/2022 | Zhang et al. | |
| 11,302,406 B2 | 4/2022 | Harari | |
| 2020/0381450 A1 | 12/2020 | Lue et al. | |
| 2021/0118902 A1* | 4/2021 | Kanamori | H01L 21/31111 |
| 2021/0143162 A1* | 5/2021 | Yun | H10B 41/40 |
| 2021/0375919 A1 | 12/2021 | Wang et al. | |
| 2023/0066186 A1* | 3/2023 | Kang | H10B 43/10 |
| 2023/0109723 A1* | 4/2023 | Wu | H10B 43/10 |
| | | | 257/314 |
| 2023/0225131 A1* | 7/2023 | Lin | H10B 51/20 |
| | | | 257/295 |
| 2024/0049467 A1* | 2/2024 | Kang | H10B 43/27 |

* cited by examiner

SEMICONDUCTOR DEVICE

CROSS-REFERENCE TO RELATED APPLICATION

This application claims priority from Korean Patent Application No. 10-2022-0111331 filed on Sep. 2, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor devices and more particularly to semiconductor devices including a ferroelectric field effect transistor (FeFET).

2. Description of the Related Art

Higher integration of semiconductor devices is required to satisfy consumer demands for superior performance and inexpensive prices. In the case of two-dimensional or planar semiconductor devices, since their integration is mainly determined by the area occupied by a unit cell, integration is greatly influenced by the level of a fine pattern forming technology.

However, recently, as the design rule of a semiconductor device rapidly decreases, due to the resolution limitation of a process for forming the patterns necessary for the implementation of a semiconductor device, there is a limit in forming a fine pattern. Thus, three-dimensional semiconductor devices in which cells are three-dimensionally arranged have been proposed.

SUMMARY

Aspects of the present disclosure provide semiconductor devices having improved product reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some aspects of the present disclosure, there is provided a semiconductor device including a substrate; a first interlayer insulating layer, on the substrate, comprising a first interconnection; a common source plate on the first interlayer insulating layer; a conductive layer extending in a first direction on the common source plate; a ferroelectric layer on one sidewall of the conductive layer; a channel layer on the ferroelectric layer; a first conductive pillar, on the channel layer, penetrating the common source plate and being connected to the first interconnection; and a second conductive pillar, on the channel layer, spaced apart from the first conductive pillar in the first direction and connected to the common source plate, the ferroelectric layer and the channel layer between the common source plate and the first conductive pillar.

According to some aspects of the present disclosure, there is provided a semiconductor device including a substrate; a first interlayer insulating layer, on the substrate, comprising a first via and a first interconnection; a common source plate on the first interlayer insulating layer; a plurality of stacks, on the common source plate, extending in a first direction and being arranged in a second direction, and each of the plurality of stacks comprising insulating layers and conductive layers that are alternately stacked in a third direction; a plurality of separation plugs between the plurality of stacks; a trench configured to separate the plurality of separation plugs and comprising a first part that penetrates the common source plate, and a second part that does not penetrate the common source plate; a ferroelectric layer extending along the trench; a channel layer on the ferroelectric layer; a bit line, on the channel layer in the first part, extending in the third direction and being connected to the first interconnection; a source line, on the channel layer in the second part, extending in the third direction and being connected to the common source plate; and an isolation layer in the trench between the bit line and the source line.

According to some aspects of the present disclosure, there is provided a semiconductor device including a substrate; a first interlayer insulating layer, on the substrate, comprising a first interconnection; a common source plate on the first interlayer insulating layer; a stack, on the common source plate, extending in a first direction and comprising insulating layers and conductive layers that are alternately stacked; a ferroelectric layer on one sidewall of the conductive layer; a channel layer on the ferroelectric layer; and a plurality of first conductive pillars and a plurality of second conductive pillars, on the channel layer, extending in a vertical direction and being alternately arranged in the first direction, wherein the plurality of first conductive pillars penetrating the common source plate and being connected to the first interconnection, the plurality of second conductive pillars being connected to the common source plate, and the ferroelectric layer and the channel layer between the common source plate and the first conductive pillars.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
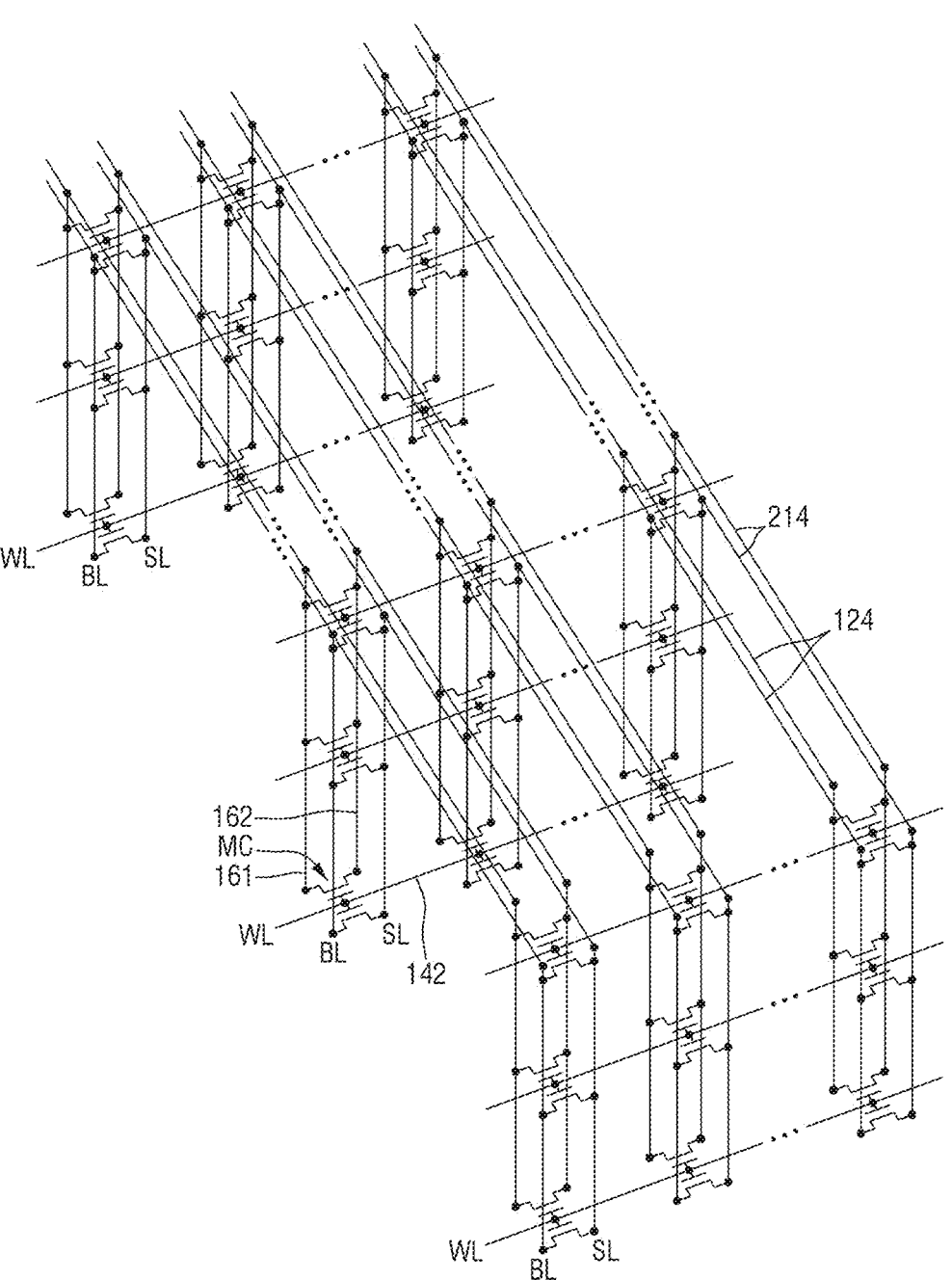
FIG. 1 is an example circuit diagram of a memory device according to some example embodiments.

FIG. 1 is an example circuit diagram of a memory device according to some example embodiments.

Referring to FIG. 1, a memory array of a semiconductor device according to some example embodiments may include a plurality of bit lines BL 161, a plurality of source lines SL 162, a plurality of word lines WL 142, and a plurality of memory cells MC.

The memory cells MC may each operate as a transistor. A gate of each transistor may be electrically connected to a word line WL, a first source/drain region of each transistor may be electrically connected to the bit line BL, and a second source/drain region of each transistor may be electrically connected to the source line SL.

A plurality of memory cells MC in a same row may share a word line WL, and the memory cells MC in a same column may share a source line SL and a bit line BL.

Memory cells in a same horizontal row of a memory array 2 may share a common word line, and memory cells 8 in a same vertical column of the memory array 2 may share a common source line and a common bit line.

A first interconnection 124 may be electrically connected to a plurality of bit lines BL. A second interconnection 214 may be electrically connected to a plurality of source lines SL. For each of the memory cells MC, a corresponding word line WL, a corresponding first interconnection 124, and a corresponding second interconnection 214 may be selected and individually addressed.

A semiconductor device according to some example embodiments may be a flash memory device, and may include a ferroelectric field effect transistor (FeFET). For example, the semiconductor device may be a NOR flash memory.

Figure 2:
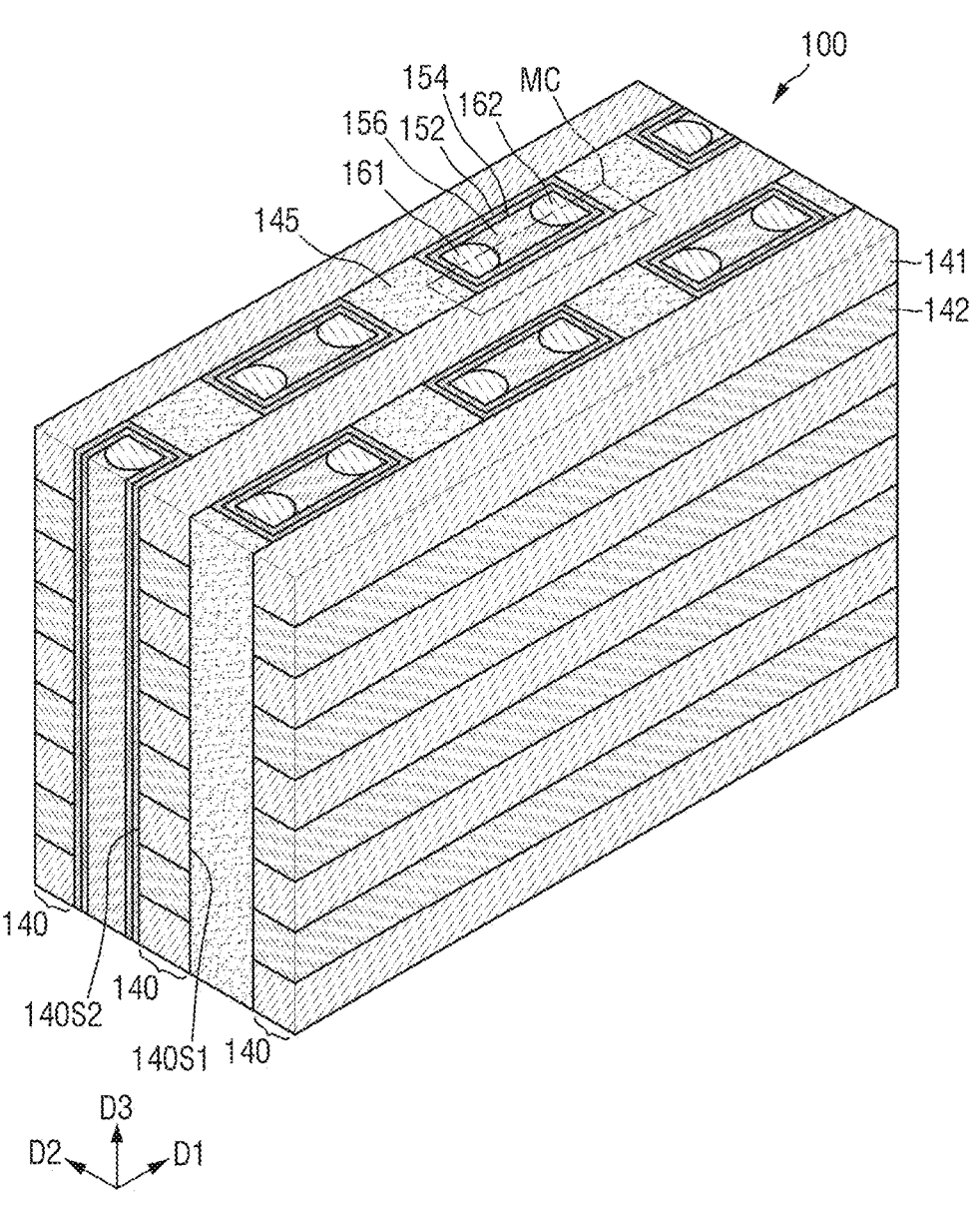
FIG. 2 is a schematic perspective view of a semiconductor device according to some example embodiments.
Figure 3:
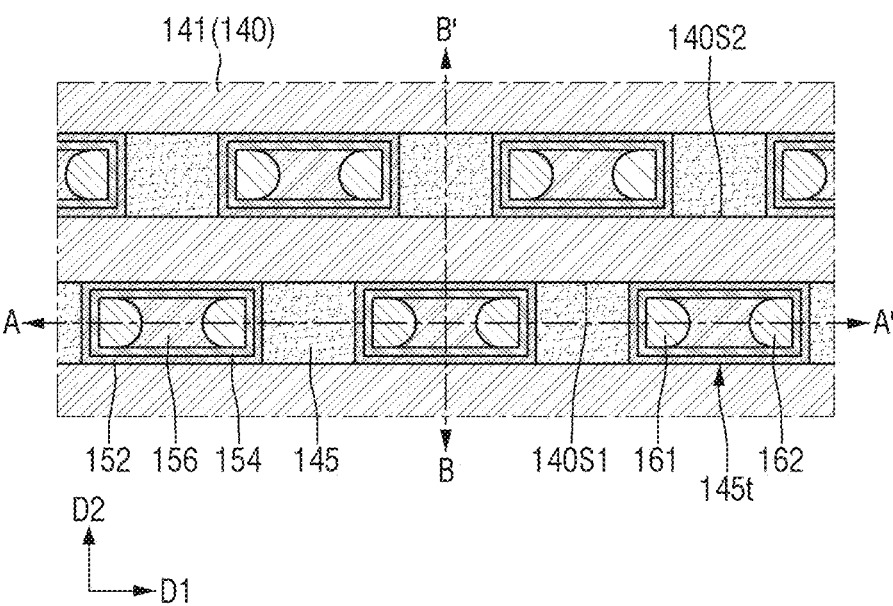
FIG. 3 is a schematic layout diagram of a semiconductor device according to some example embodiments.
Figure 4:
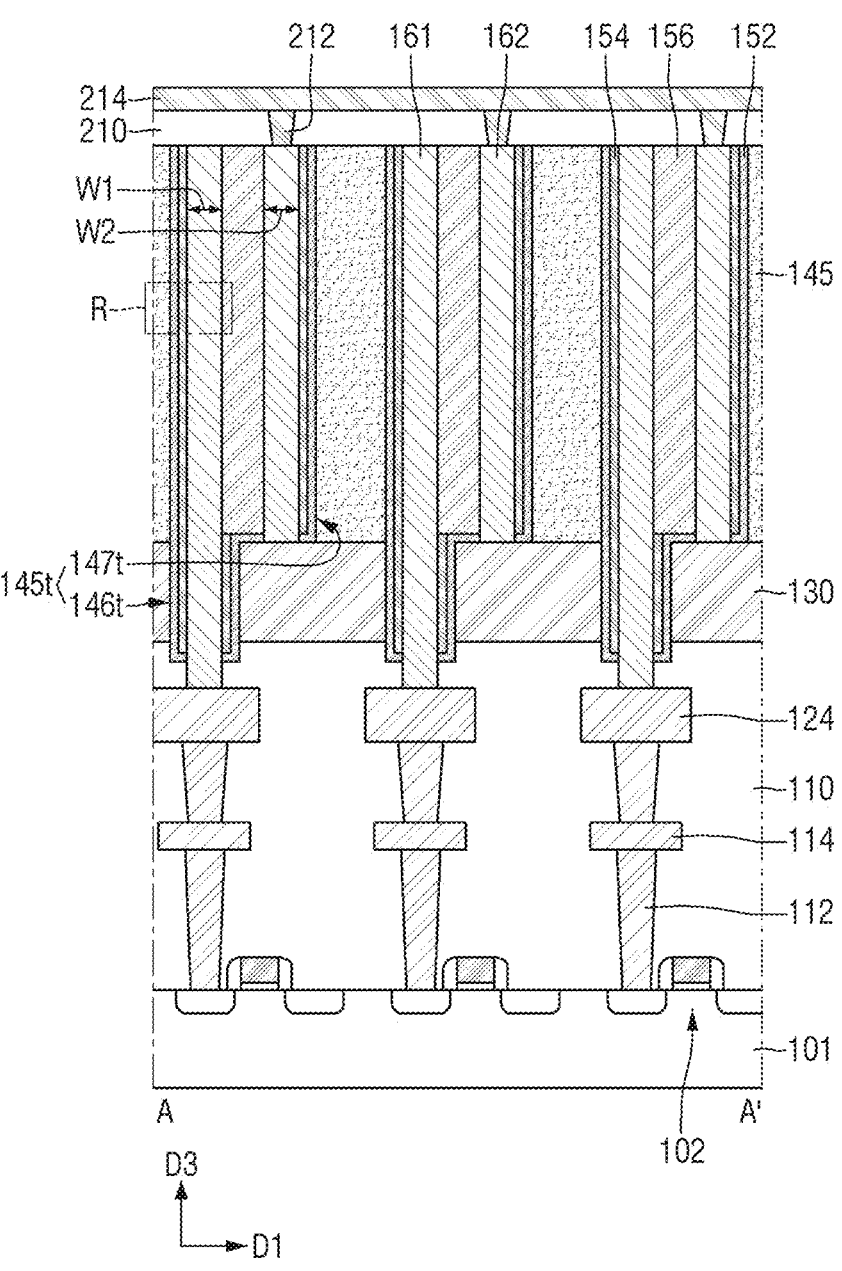
FIG. 4 is a cross-sectional view taken along line A-A' of FIG. 3.
Figure 5:
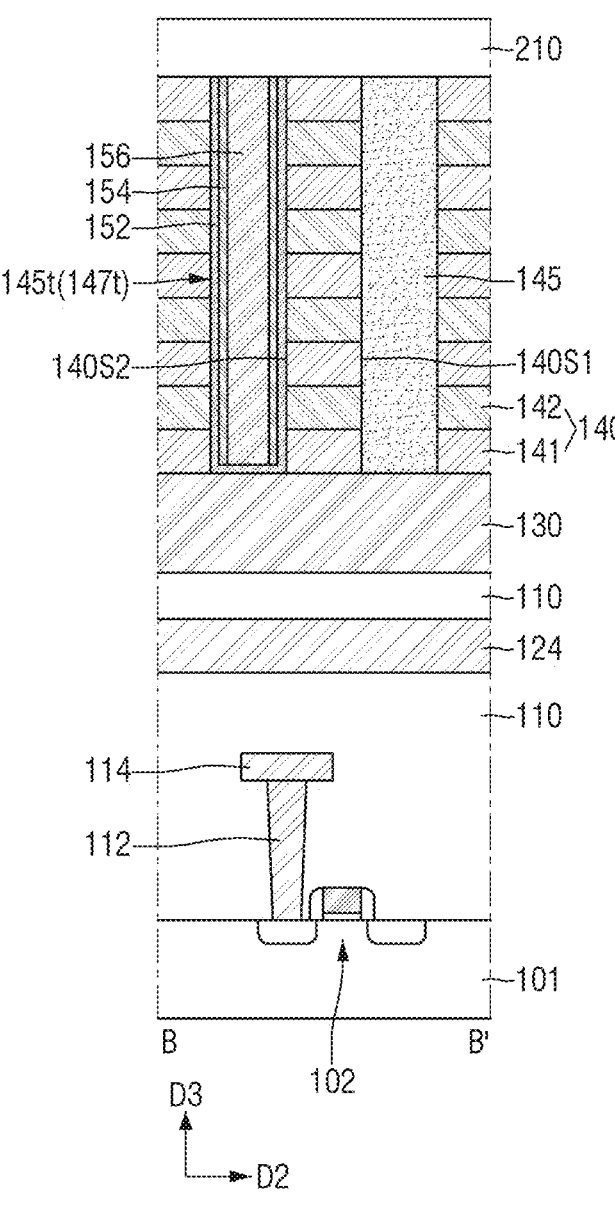
FIG. 5 is a cross-sectional view taken along line B-B' of FIG. 3.

FIG. 2 is a schematic perspective view of a semiconductor device according to some example embodiments. FIG. 3 is a schematic layout diagram of a semiconductor device according to some example embodiments. FIG. 4 is a cross-sectional view taken along line A-A' of FIG. 3. FIG. 5 is a cross-sectional view taken along line B-B' of FIG. 3.

Referring to FIGS. 2 to 5, a semiconductor device according to some example embodiments may include a substrate 101, a first interlayer insulating layer 110, a common source plate 130, stacks 140, separation plugs 145, a ferroelectric layer 152, a channel layer 154, an isolation layer 156, a first conductive pillar 161, a second conductive pillar 162, and a second interlayer insulating layer 210.

The substrate 101 may include, for example, a semiconductor substrate such as a silicon substrate, a germanium substrate, or a silicon-germanium substrate. Alternatively, the substrate 101 may include a silicon-on-insulator (SOI) substrate or a germanium-on-insulator (GOI) substrate.

A peripheral circuit device 102 may be disposed on the substrate 101. A first via 112 and first interconnections 114 and 124 may be connected to the peripheral circuit device 102. The first interconnection 124 may be disposed on the first interconnection 114. The first interconnection 124 may be an uppermost interconnection in a third direction D3.

The first interlayer insulating layer 110 may be disposed on the substrate 101. The first interlayer insulating layer 110 may cover the peripheral circuit device 102, the first via 112, and the first interconnections 114 and 124.

The common source plate 130 may be disposed on the first interlayer insulating layer 110. The common source plate 130 may include, for example, doped polysilicon, metal, or metal nitride, but is not limited thereto.

The stack 140 may be disposed on the common source plate 130. The stack 140 may extend in a first direction D1. The stack 140 may include insulating layers 141 and conductive layers 142 that are alternately stacked in the third direction D3.

Here, the first direction D1 and a second direction D2 may be parallel to an upper surface of the substrate 101 and the third direction D3 may be a direction perpendicular to the upper surface of the substrate 101. The second direction D2 may be perpendicular to the first direction D1, and the third direction D3 may be perpendicular to the first and second directions D1 and D2. An upper side, a lower side, an upper surface, and a lower surface may be determined based on the third direction D3.

The insulating layer 141 may extend in the first direction D1. The insulating layer 141 may include an insulating material. For example, the insulating layer 141 may include silicon nitride, but is not limited thereto.

The conductive layer 142 may extend in the first direction D1. The conductive layer 142 may be the word line WL of FIG. 1. The conductive layer 142 may include a conductive material. For example, a conductive layer 142 may include at least one of a doped semiconductor material (e.g., doped silicon, doped germanium, or the like), conductive metal nitride (e.g., titanium nitride, or tantalum nitride), metal (e.g., tungsten, titanium, or tantalum), a metal-semiconductor compound (e.g., tungsten silicide, cobalt silicide, or titanium silicide), or combinations of the same.

The stack 140 may be arranged in the second direction D2. The stack 140 may include a first sidewall 140S1 and a second sidewall 140S2 opposite to the first sidewall 140S1 in the second direction D2.

The separation plugs 145 may be disposed on the first sidewall 140S1 and the second sidewall 140S2 of the stack 140. The separation plug 145 may be disposed between the stacks 140. The separation plug 145 may be disposed between the stacks 140 neighboring in the second direction D2. The separation plug 145 may be arranged in the first direction D1 between the stacks 140.

The separation plug 145 may include an insulating material. For example, the separation plug 145 may include silicon nitride, but is not limited thereto.

In a semiconductor device according to some example embodiments, the separation plugs 145 may be arranged in a zigzag manner in a plan view. With respect to one stack 140, the separation plug 145 on the first sidewall 140S1 may not overlap the separation plug 145 on the second sidewall 140S2 in the second direction D2.

The separation plugs 145 may be separated from each other by trenches 145t. The trenches 145t may be arranged in the first direction D1. Each trench 145t may be defined by the separation plugs 145 neighboring in the first direction D1 and the stacks 140 neighboring in the second direction D2. The sidewalls of each trench 145t in the first direction D1 may be defined by the separation plugs 145 and the sidewalls of the trench 145t in the second direction D2 may be defined by the first and second sidewalls 140S1 and 140S2.

A bottom surface of the trench 145t may have a step. Each trench 145t may include a first part 146t penetrating the common source plate 130 and a second part 147t not penetrating the common source plate 130. For example, a bottom surface of the first part 146t may be disposed in the first interlayer insulating layer 110 and may be located above the first interconnection 124. Sidewalls of the first part 146t may be defined by the separation plug 145, the common source plate 130, and the first interlayer insulating layer 110, and sidewalls of the second part 147t may be defined by the separation plug 145.

The memory cells MC may be formed on the first and second sidewalls 140S1 and 140S2 of the stack 140. The memory cells MC may be arranged on the first and second sidewalls 140S1 and 140S2 in the first direction D1 and the third direction D3. The memory cell MC may include the conductive layer 142, the ferroelectric layer 152, the channel layer 154, the isolation layer 156, the first conductive pillar 161, and the second conductive pillar 162. The memory cells MC may be separated from each other by the separation plugs 145. The memory cell MC may be disposed in the trench 145t.

The ferroelectric layer 152 may extend (e.g., may conformally extend) along the sidewall of the trench 145t. The ferroelectric layer 152 may be disposed on the sidewall of the separation plug 145 in the first direction D1 and the first and second sidewalls of the stack 140. The ferroelectric layer 152 may extend (e.g., may conformally extend) along at least a portion of the bottom surface of the trench 145t. The ferroelectric layer 152 may extend (e.g., may conformally extend) along the bottom surface of the trench 145t in which the first conductive pillar 161 and the second conductive pillar 162 are not disposed. A lower surface of the ferroelectric layer 152 may be located below a lower surface of the common source plate 130, and be located above the first interconnection 124.

The ferroelectric layer 152 may include or be formed of a ferroelectric such as barium titanate (BaTiO$_3$), lead zirconate titanate (PZT; PbZrTiO$_3$), strontium bismuth tantalate (STB; SrBi$_2$Ta$_2$O$_9$), bismuth ferrite (BFO; BiFeO$_3$), hafnium oxide (HfO$_2$), or the like, but is not limited thereto.

When the ferroelectric layer 152 is an oxide film based on hafnium (Hf), the ferroelectric layer 152 may include zirconium (Zr), silicon (Si), aluminum (Al), yttrium (Y), gadolinium (Gd), lanthanum (La), scandium (Sc), strontium (Sr), and the like.

The channel layer 154 may be disposed on the ferroelectric layer 152. The channel layer 154 may extend (e.g., may conformally extend) along the ferroelectric layer 152. The channel layer 154 may extend (e.g., may conformally extend) along an inner sidewall of the ferroelectric layer 152. The channel layer 154 is disposed between the ferroelectric layer 152 and the isolation layer 156.

The channel layer 154 may be, for example, doped polysilicon, doped silicon, silicon germanium (SiGe), or a semiconductor material formed through selective epitaxial growth (SEG), but is not limited thereto. The channel layer 154 may be an oxide semiconductor material. The oxide semiconductor material may include, for example, IGZO, Sn-IGZO, IWO, CuS2, CuSe$_2$, WSe$_2$, IZO, ZTO, or YZO, but is not limited thereto. For example, the channel layer 154 may include, for example, MoS$_2$, MoSe$_2$, or WS$_2$.

The first conductive pillar 161 and the second conductive pillar 162 may be disposed on the channel layer 154 and spaced apart from each other in the first direction D1. In a plan view, the first conductive pillar 161 may have a shape convex toward the second conductive pillar 162, and the second conductive pillar 162 may have a shape convex toward the first conductive pillar 161.

A maximum width W1 of the first conductive pillar 161 in the first direction D1 may be substantially equal to a maximum width W2 of the second conductive pillar 162 in the first direction D1. In a semiconductor device according to some example embodiments, the maximum width W1 of the first conductive pillar 161 in the first direction D1 and the maximum width W2 of the second conductive pillar 162 in the first direction D1 may be substantially constant in a direction away from the substrate 101.

The first conductive pillar 161 may be disposed on the first part 146t of the trench 145t. The first conductive pillar 161 may extend in the third direction D3 and penetrate through the bottom surface of the first part 146t of the trench 145t. The first conductive pillar 161 may penetrate the common source plate 130 and be electrically connected to the first interconnection 124. For example, the first conductive pillar 161 may be in contact with the first interconnection 124. That is, the first conductive pillar 161 may be electrically connected to the first interconnection 124 without a separate contact.

The ferroelectric layer 152 may be disposed between the first conductive pillar 161 and the separation plug 145 and between the common source plate 130 and the first interlayer insulating layer 110, and the channel layer 154 may be disposed between the ferroelectric layer 152 and the first conductive pillar 161.

The second conductive pillar 162 may be disposed on the second part 147t of the trench 145t. The second conductive pillar 162 may extend in the third direction D3 and be disposed on the bottom surface of the second part 147t of the trench 145t. The second conductive pillar 162 may be electrically connected to the common source plate 130. For example, the second conductive pillar 162 may be in contact with the common source plate 130.

The ferroelectric layer 152 may be disposed between the second conductive pillar 162 and the separation plug 145, and the channel layer 154 may be disposed between the ferroelectric layer 152 and the second conductive pillar 162.

The isolation layer 156 may be filled in the remaining portion of the trench 145t in which the ferroelectric layer 152, the channel layer 154, and the first and second conductive pillars 161 and 162 are disposed. The isolation layer 156 may be filled between the first conductive pillar 161 and the second conductive pillar 162. The isolation layer 156 may isolate the first conductive pillar 161 from the second conductive pillar 162. For example, the isolation layer 156 may completely separate the first conductive pillar 161 from the second conductive pillar 162.

The isolation layer 156 may include an insulating material. For example, the isolation layer 156 may include silicon oxide, but is not limited thereto.

The first conductive pillar 161 may be the bit line BL of FIG. 1, and the second conductive pillar 162 may be the source line SL of FIG. 1. The ferroelectric layer 152 may transmit and receive data to and from the conductive layer 142. The ferroelectric layer 152 may provide, for example, electrons to the conductive layer 142 or receive electrons from the conductive layer 142. The channel layer 154 may serve as a path through which data (e.g., electrons) stored in the ferroelectric layer 152 moves. For example, data (e.g., electrons) stored in the ferroelectric layer 152 may exit to the channel layer 154 and may be transmitted from the first conductive pillar 161 to the second conductive pillar 162.

A plurality of second conductive pillars 162 may be electrically connected to one common source plate 130.

Accordingly, the semiconductor device may apply a voltage to the plurality of second conductive pillars 162 through the common source plate 130. The semiconductor device according to some example embodiments provides one common source plate 130 without forming a common source line for each of the first conductive pillars 161, so that process efficiency of the semiconductor device can be increased.

The second interlayer insulating layer 210 may be disposed on the stack 140, the separation plug 145, and the memory cell MC. The second interlayer insulating layer 210 may include a second via 212 and a second interconnection 214.

The second interconnection 214 may be electrically connected to the second conductive pillar 162. For example, the second via 212 may be in contact with the second conductive pillar 162 and the second interconnection 214.

That is, in the semiconductor device according to some example embodiments, the first interconnection 124 electrically connected to the first conductive pillar 161 and the second interconnection 214 electrically connected to the second conductive pillar 162 may be disposed at different levels. Compared to a case where the first interconnection 124 and the second interconnection 214 are disposed at the same level, the latitude of arrangement of the memory cell MC may be enhanced.

Figure 6:
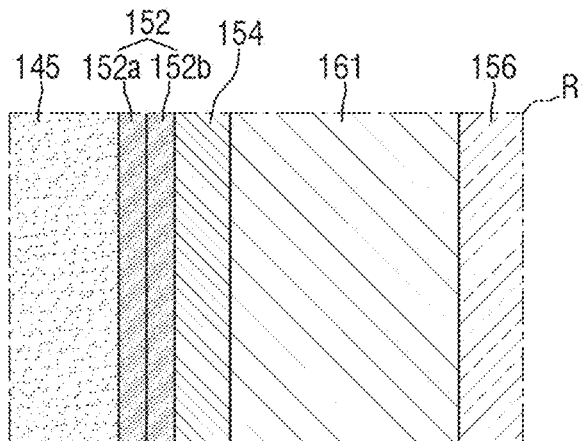
FIG. 6 is an enlarged view of portion R of FIG. 4.

FIG. 6 is an enlarged view of portion R of FIG. 4. For convenience of description, a description of the same content as that described with reference to FIGS. 1 to 5 may be omitted.

Referring to FIGS. 4 to 6, in a semiconductor device according to some example embodiments, a ferroelectric layer 152 may have a form in which two or more ferroelectric layers are coupled together or a ferroelectric layer and an insulating layer are coupled together. For example, the ferroelectric layer 152 may have a form in which two or more ferroelectric layers are laminated or a ferroelectric layer and an insulating layer are laminated.

That is, the ferroelectric layer 152 may include a first layer 152a and a second layer 152b. The first layer 152a may be disposed between a separation plug 145 and a channel layer 154, and the second layer 152b may be disposed between the first layer 152a and the channel layer 154.

The first layer 152a and the second layer 152b may be different ferroelectric layers, or one of the first and second layers 151a and 152b may be a ferroelectric layer and the other may be an insulating layer.

Figure 7:
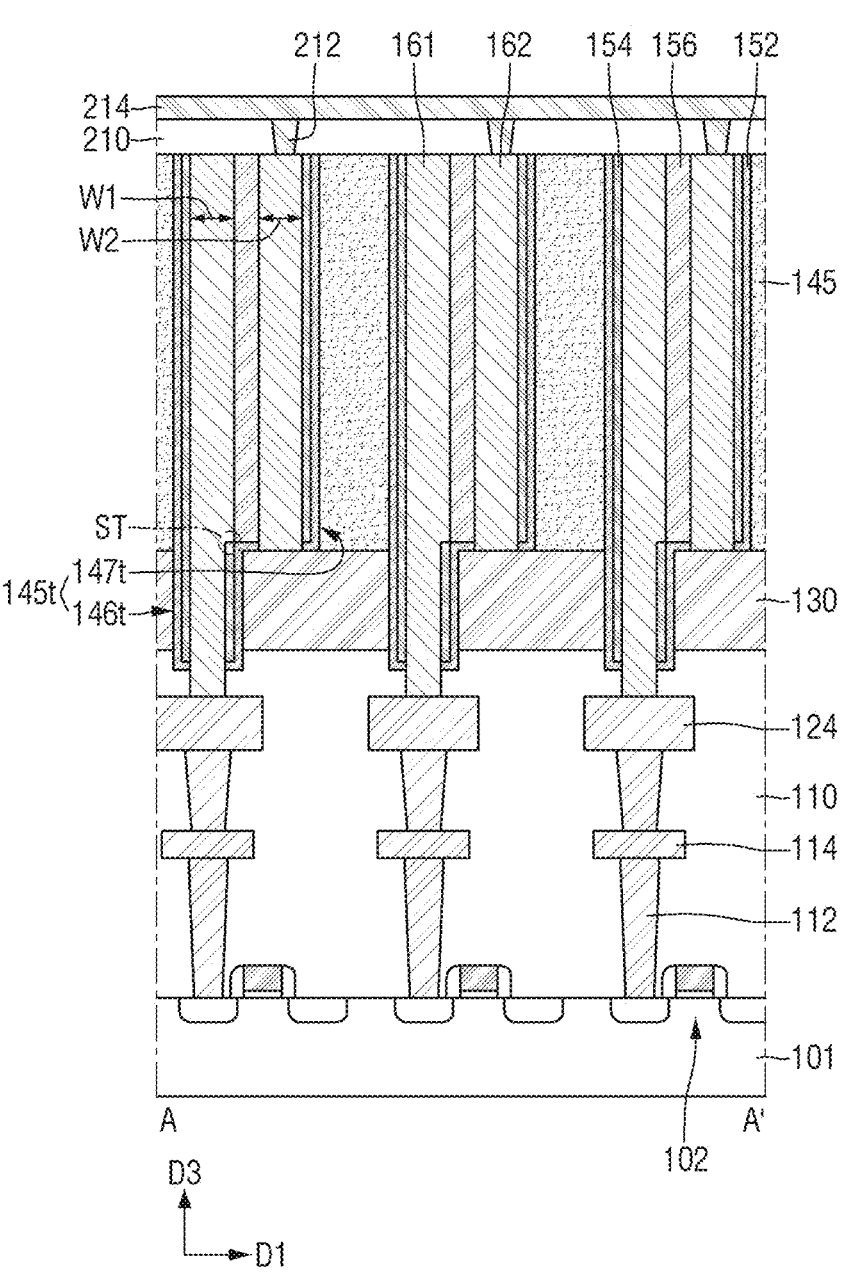
FIG. 7 is a view of a semiconductor device according to some example embodiments.

FIG. 7 is a view of a semiconductor device according to some example embodiments. For reference, FIG. 7 is a cross-sectional view taken along line A-A' of FIG. 3. For convenience of description, a description of the same content as that described with reference to FIGS. 1 to 5 may be omitted.

Referring to FIG. 7, in a semiconductor device according to some example embodiments, a sidewall of a first conductive pillar 161 on which an isolation layer 156 is disposed may have a step ST. In the first direction D1, a maximum width of the first conductive pillar 161 in a common source plate 130 may be less than a maximum width of the first conductive pillar 161 in the separation plug 145. At least a portion of the first conductive pillar 161 may overlap the channel layer 154 in the third direction D3. The step ST may be a portion of the isolation layer 156 extending above the common source plate 130 along the ferroelectric layer 152, and the step ST may have a same height of an upper surface as a portion of the ferroelectric layer extending in the first direction along an upper surface of the common source plate 130.

Figure 8:
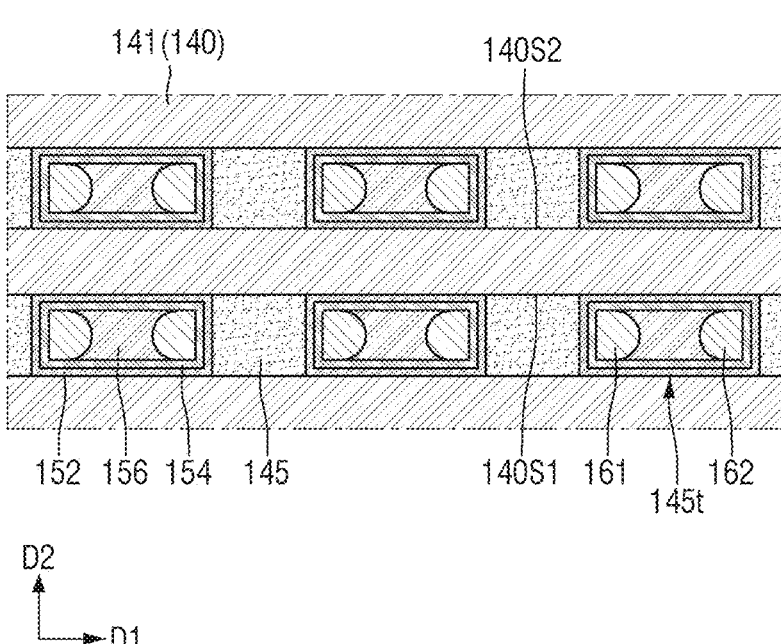
FIG. 8 is a schematic layout diagram of a semiconductor device according to some example embodiments.

FIG. 8 is a schematic layout diagram of a semiconductor device according to some example embodiments. For convenience of description, a description of the same content as that described with reference to FIGS. 1 to 5 may be omitted.

Referring to FIG. 8, in a semiconductor device according to some example embodiments, the separation plugs 145 may be continuously arranged along the second direction D2. With respect to one stack 140, the separation plug 145 on a first sidewall 140S1 may overlap the separation plug 145 on a second sidewall 140S2 in the second direction D2. In some example embodiments, the overlap may be such that the separation plugs 145 completely overlap, and in some other example embodiments, the overlap may be partial (e.g., the overlap may be greater than a 1% overlap to less than a 99% overlap of the width of the separation plugs 145 in a first direction D1).

Figure 9:
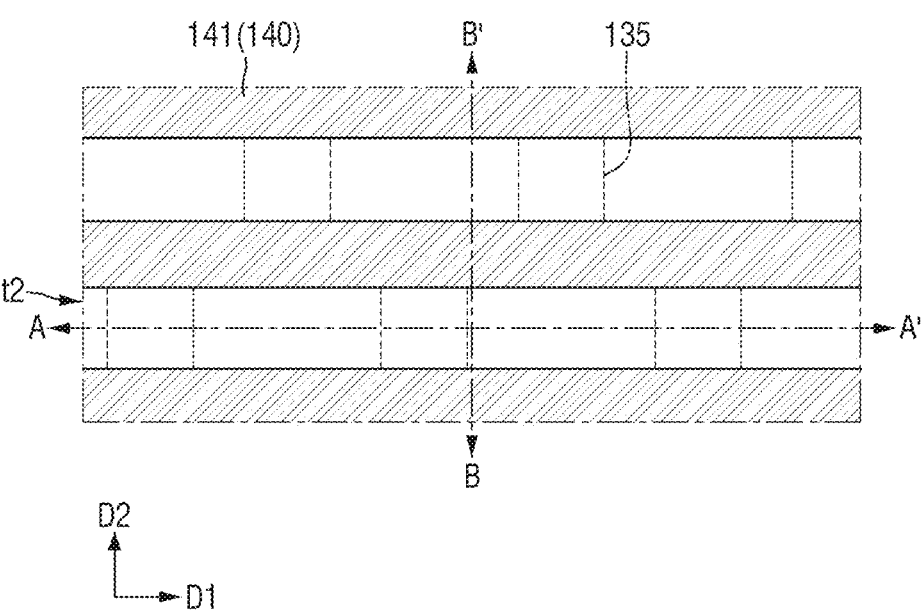
FIGS. 9 to 26 are views illustrating intermediate stages of manufacture, provided to explain a method of manufacturing a semiconductor device according to some example embodiments.
Figure 10:
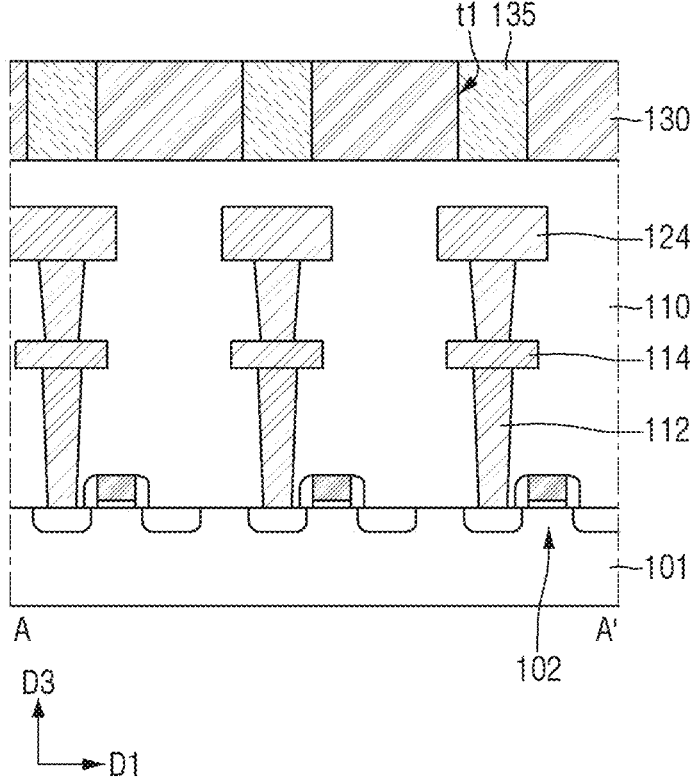
Figure 11:
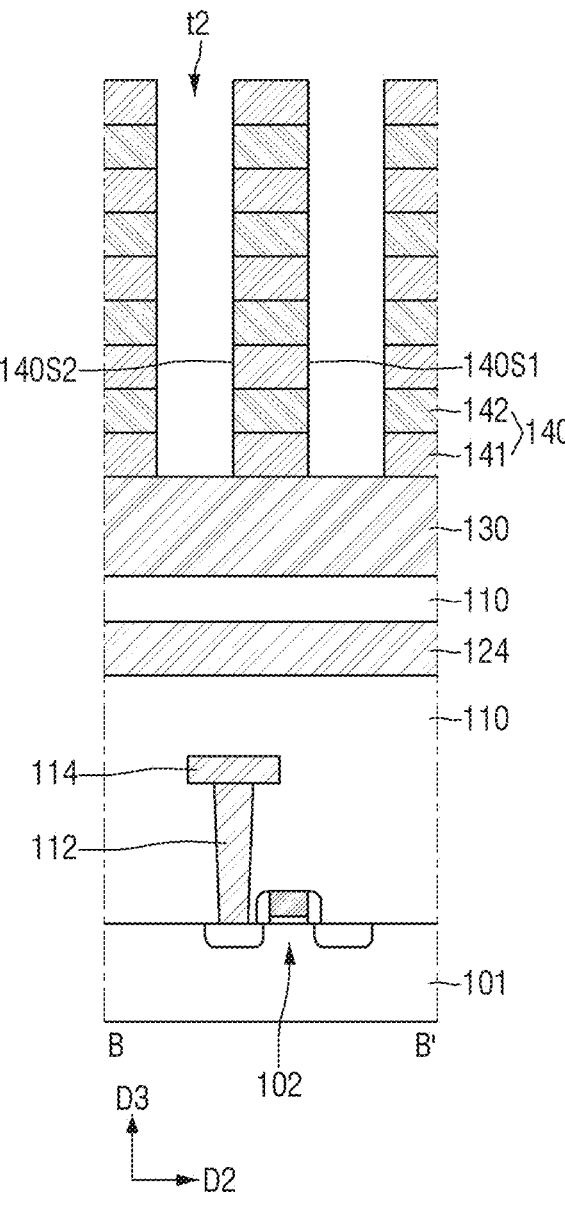

FIGS. 9 to 26 are views illustrating intermediate stages of manufacture, provided to explain a method of manufacturing a semiconductor device according to some example embodiments. For reference, FIGS. 9, 12, 15, 18, 21, and 24 are schematic layout diagrams. FIG. 10 is a cross-sectional view taken along line A-A' of FIG. 9, and FIG. 11 is a cross-sectional view taken along line B-B' of FIG. 9. FIGS. 13 and 14 are cross-sectional views respectively taken along lines A-A' and B-B' of FIG. 12. FIGS. 16 and 17 are cross-sectional views respectively taken along lines A-A' and B-B' of FIG. 15. FIGS. 19 and 20 are cross-sectional views respectively taken along lines A-A' and B-B' of FIG. 18. FIGS. 22 and 23 are cross-sectional views respectively taken along lines A-A' and B-B' of FIG. 21. FIGS. 25 and 26 are cross-sectional views taken along line A-A' of FIG. 24.

For convenience of description, a description of the same content as that described with reference to FIGS. 1 to 5 may be omitted.

Referring to FIGS. 9 to 11, a first interlayer insulating layer 110 including a first via 112 and first interconnections 114 and 124 may be formed on a substrate 101.

A pre-common source plate may be formed on the first interlayer insulating layer 110. The pre-common source plate may cover an upper surface of the first interlayer insulating layer 110.

Then, a trench t1 may be formed in the pre-common source plate. Accordingly, a common source plate 130 may be formed. The trench t1 may expose the upper surface of the first interlayer insulating layer 110. For example, the trench t1 may be formed at a position that overlaps the first interconnection 124, later electrically connected to a first conductive pillar 161, in the third direction D3.

Then, a sacrificial film 135 that is filled in the trench t1 may be formed. For example, the sacrificial film 135 may be formed to be filled in the trench t1 and to cover the common source plate 130, and a planarization process may be performed. Accordingly, an upper surface of the sacrificial film 135 may be coplanar with an upper surface of the common source plate 130.

The sacrificial film 135 may include an insulating material. For example, the sacrificial film 135 may include silicon oxide, but is not limited thereto. The sacrificial film 135 may include, for example, the same material as a separation plug 145.

Then, a stack 140 in which insulating layers 141 and conductive layers 142 are alternately stacked may be formed on the common source plate 130 and the sacrificial film 135. The stack 140 may be separated by a trench t2. A sidewall of the stack 140 may be defined by the trench t2. The stack 140 may extend in the first direction D1 and be arranged in the second direction D2.

Figure 12:
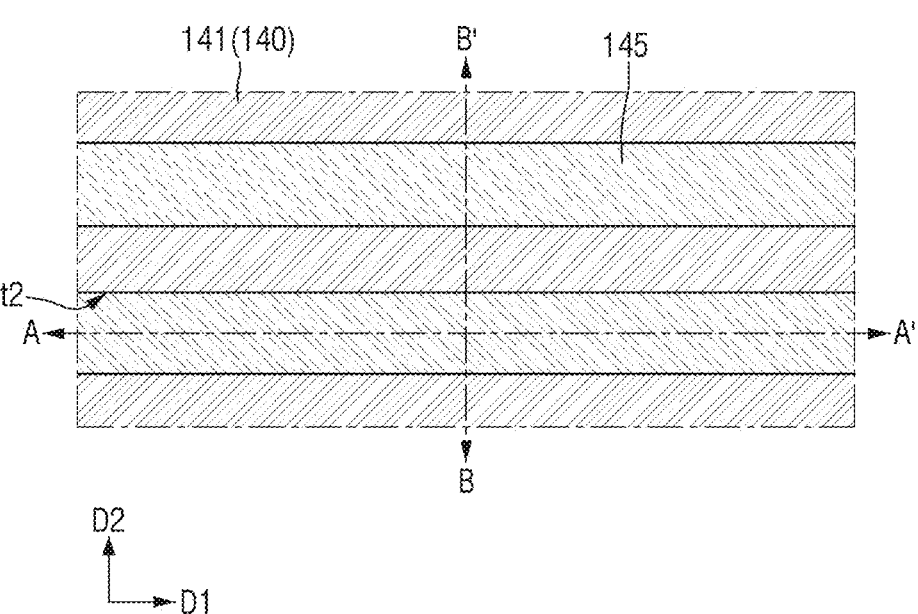
Figure 13:
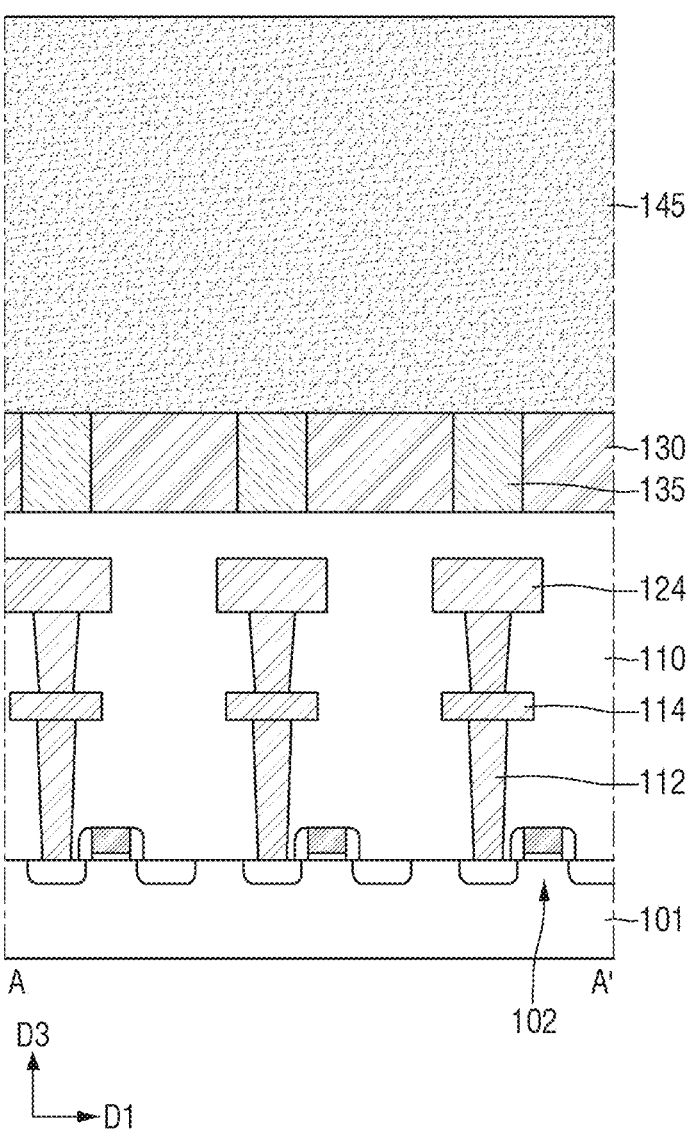
Figure 14:
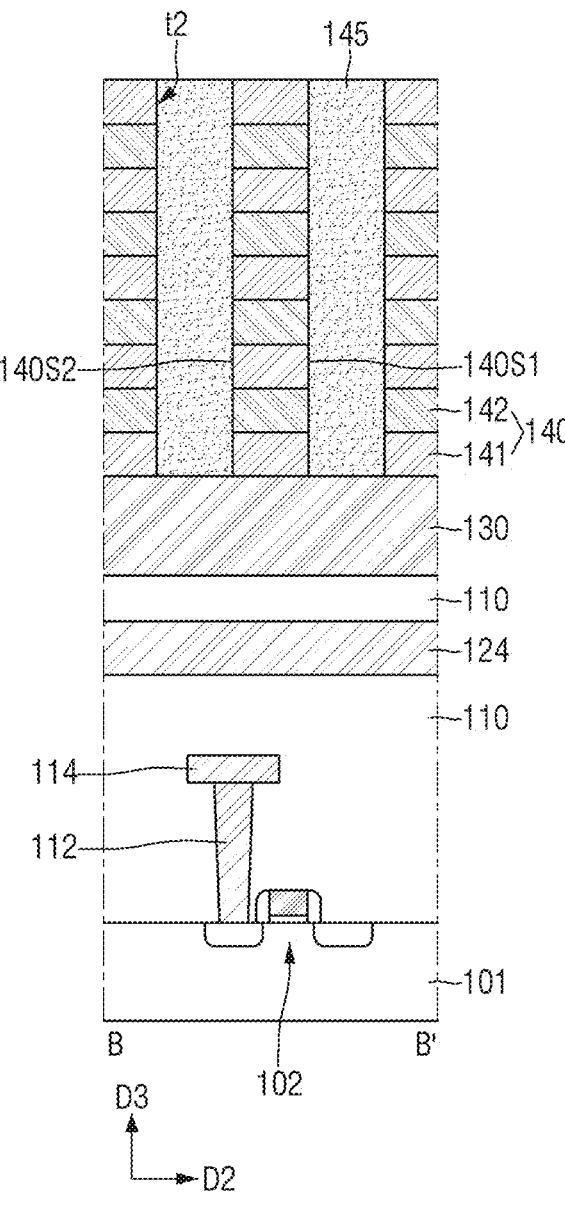

Referring to FIGS. 12 to 14, a separation plug 145 may be formed in the trench t2 such that the separation plug 145 fills (e.g., completely fills) the trench t2.

Figure 15:
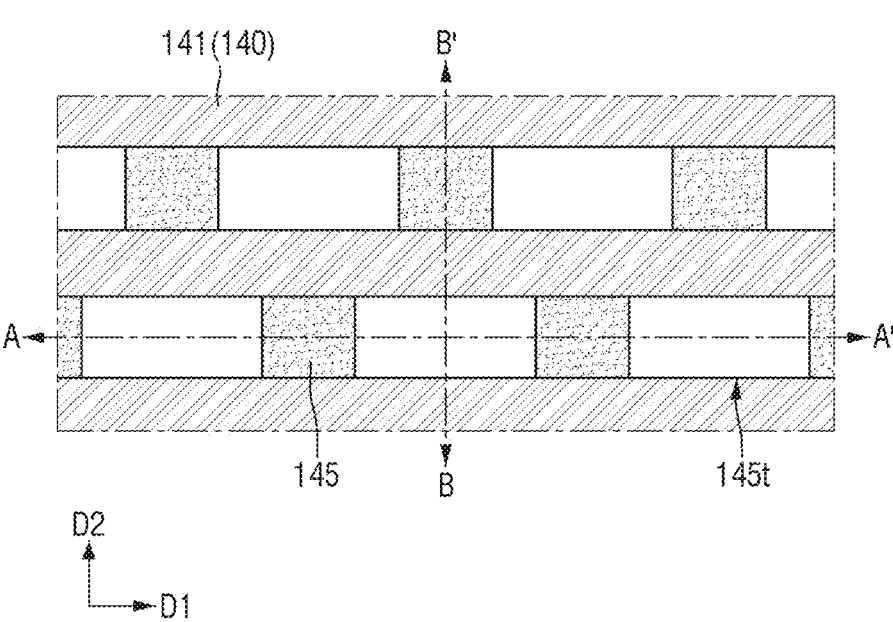
Figure 16:
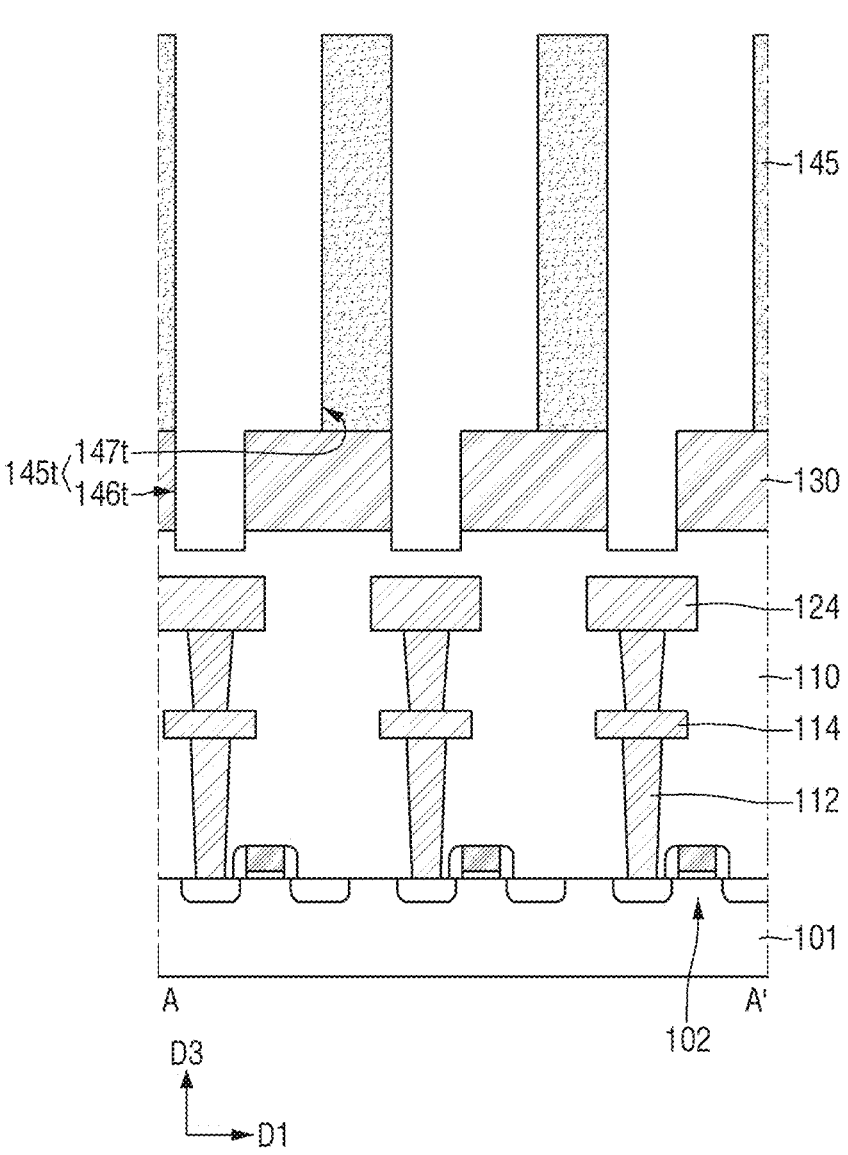
Figure 17:
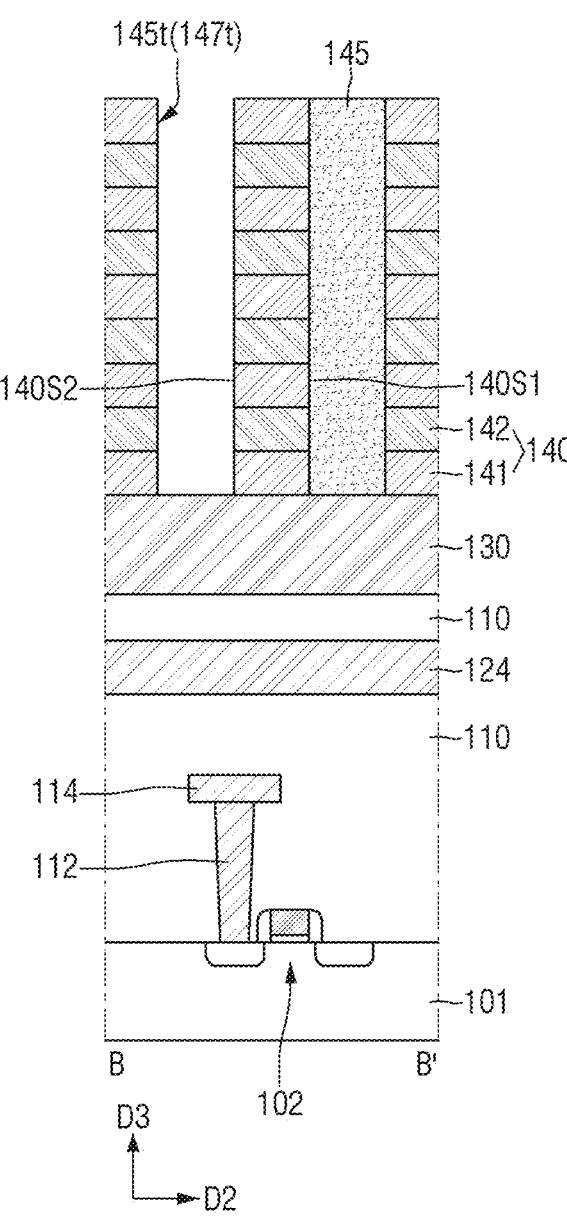

Referring to FIGS. 15 to 17, a trench 145*t* that separates the separation plugs 145 may be formed. The trench 145*t* may be formed by etching the sacrificial film 135 and the separation plug 145. In this case, due to a difference in the etching ratio between the sacrificial film 135 and the common source plate 130, the trench 145*t* may include a first part 146*t* penetrating the common source plate 130 and a second part 147*t* not penetrating the common source plate 130. The first part 146*t* may be a portion from which the sacrificial film 135 is removed. The first part 146*t* may extend into the first interlayer insulating layer 110.

Figure 18:
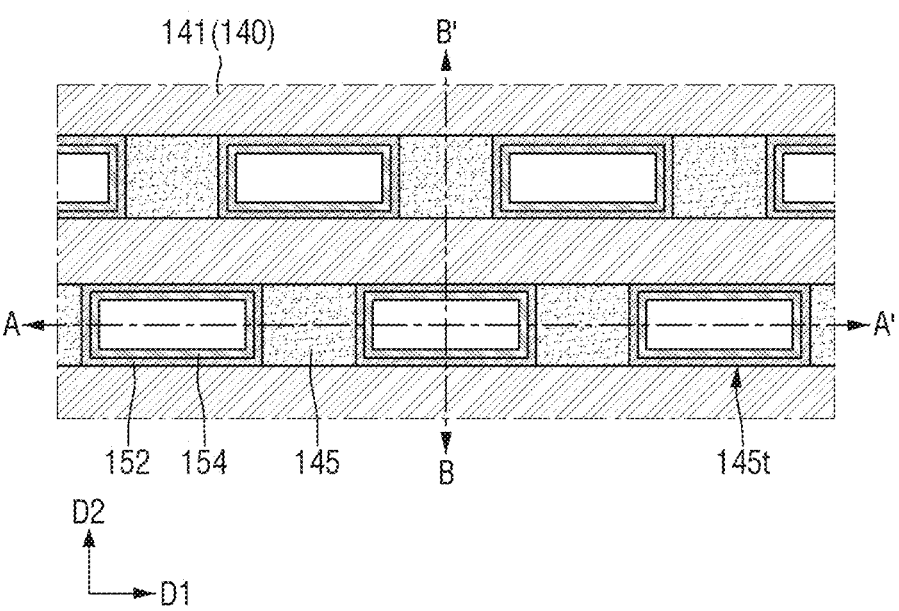
Figure 19:
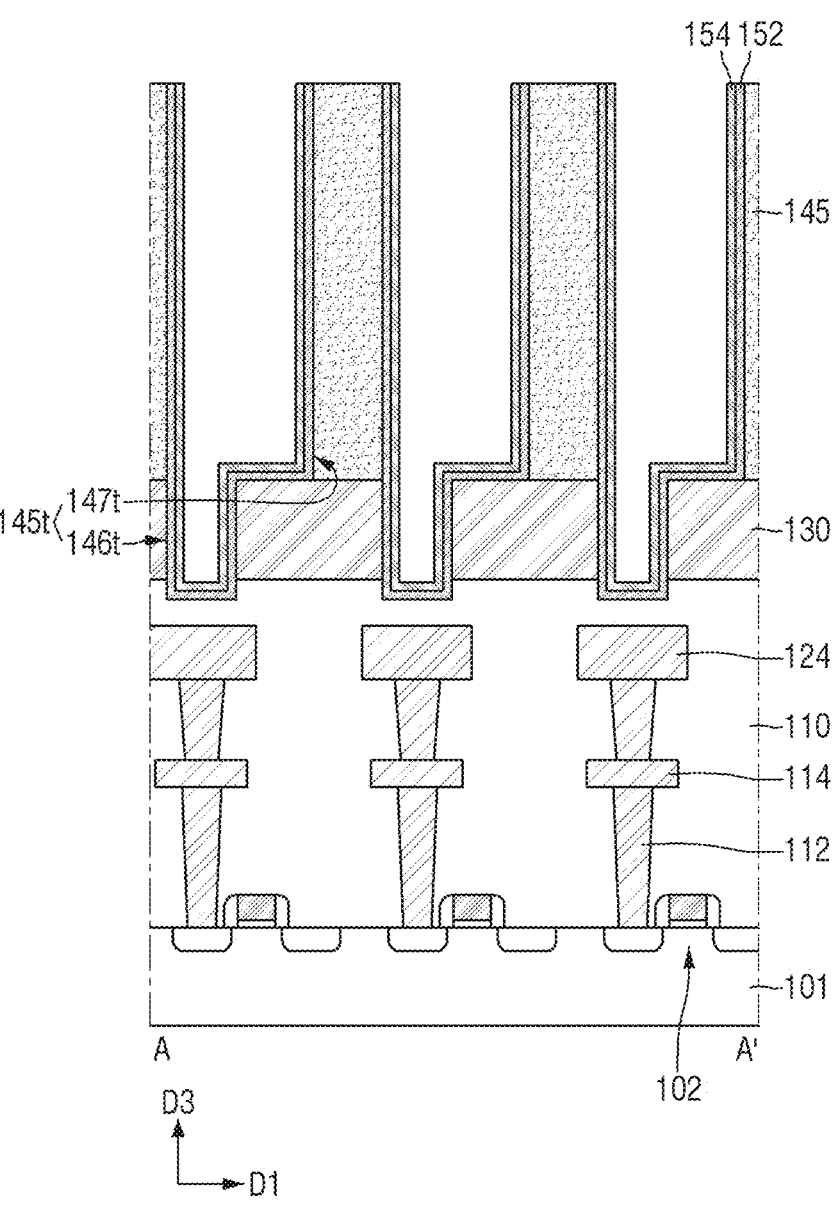
Figure 20:
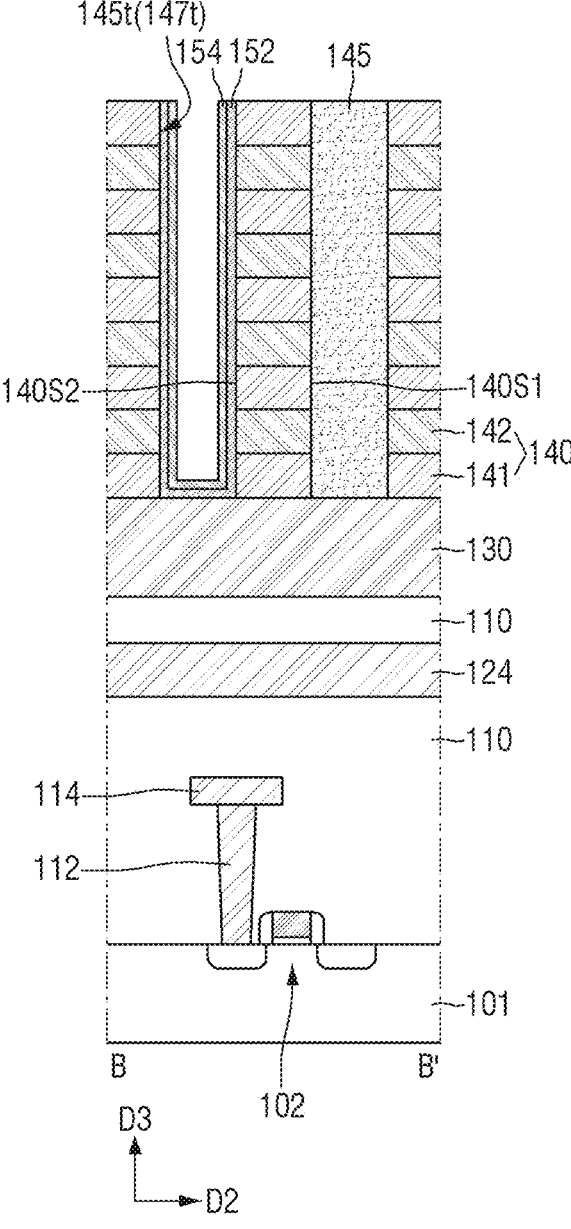

Referring to FIGS. 18 to 20, a ferroelectric layer 152 may be formed on the trench 145*t*. The ferroelectric layer 152 may extend (e.g., may conformally extend) along sidewalls and a bottom surface of the trench 145*t*. Thereafter, a channel layer 154 may be formed on the ferroelectric layer 152. The channel layer 154 may extend (e.g., may conformally extend) along the ferroelectric layer 152.

Figure 21:
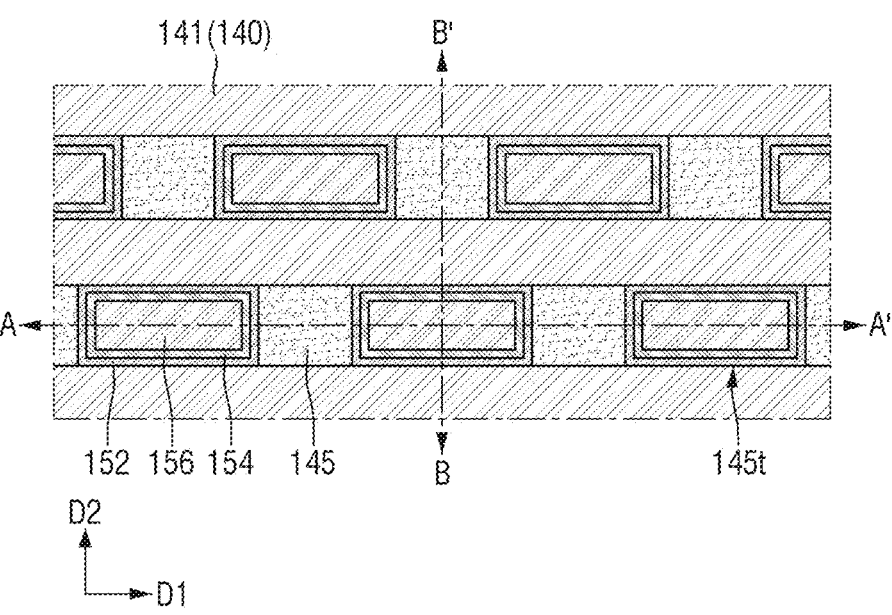
Figure 22:
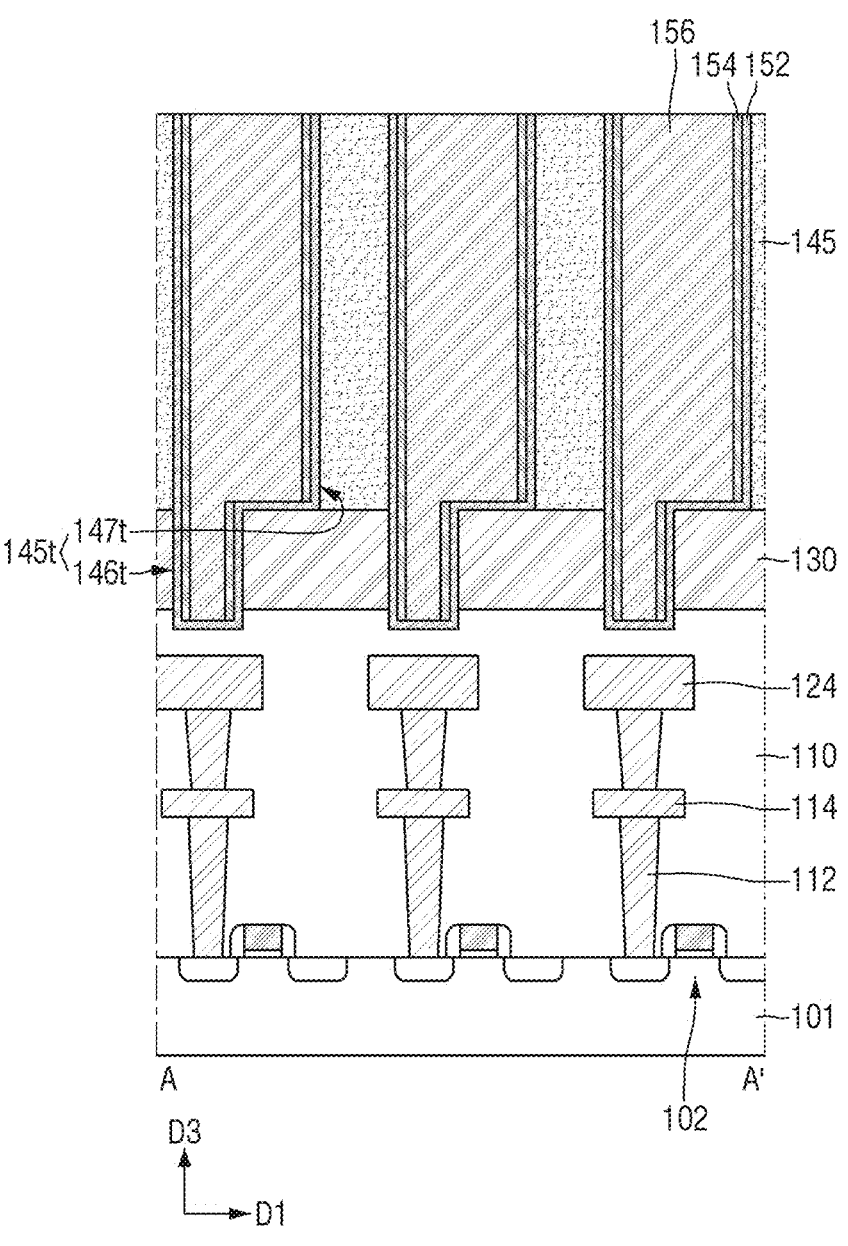
Figure 23:
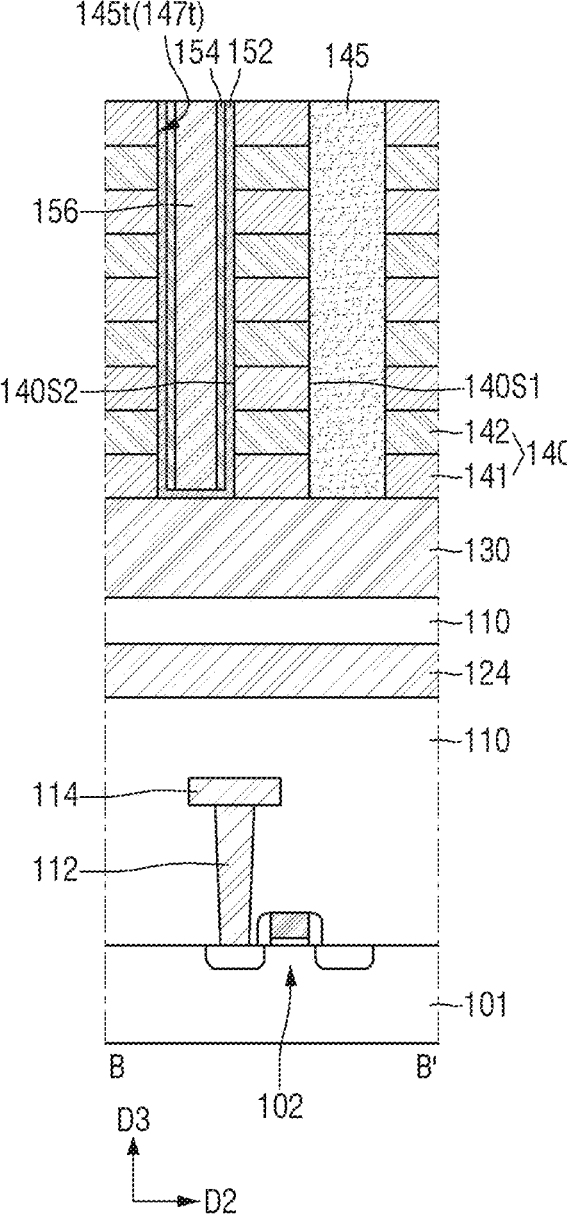

Referring to FIGS. 21 to 23, at least a portion of the channel layer 154 may be removed through the trench 145*t*. The channel layer 154 on a bottom surface of the first part 146*t* of the trench 145*t* and a bottom surface of the second part 147*t* of the trench 145*t* may be removed. In a plan view, the channel layer 154 exposed at an upper portion of the stack 140 may be removed. For example, the channel layer 154 may remain on the vertical surfaces (surfaces extending in the third direction D3) of the ferroelectric layer 152.

The channel layer 154 may be removed by, for example, an etch-back process.

Then, an isolation layer 156 may be formed to be filled in the remaining portion of the trench 145*t*. The isolation layer 156 may not overlap the channel layer 154 in the third direction D3 along the peripheries of the trench 145*t*. For example, the channel layer 154 may overlap the portion of the isolation layer 156 remaining in the first part 146*t* of the trench 145*t*, which terminates at or about the horizontal surface (surface extending in the first direction D1) of the ferroelectric layer 152.

Figure 24:
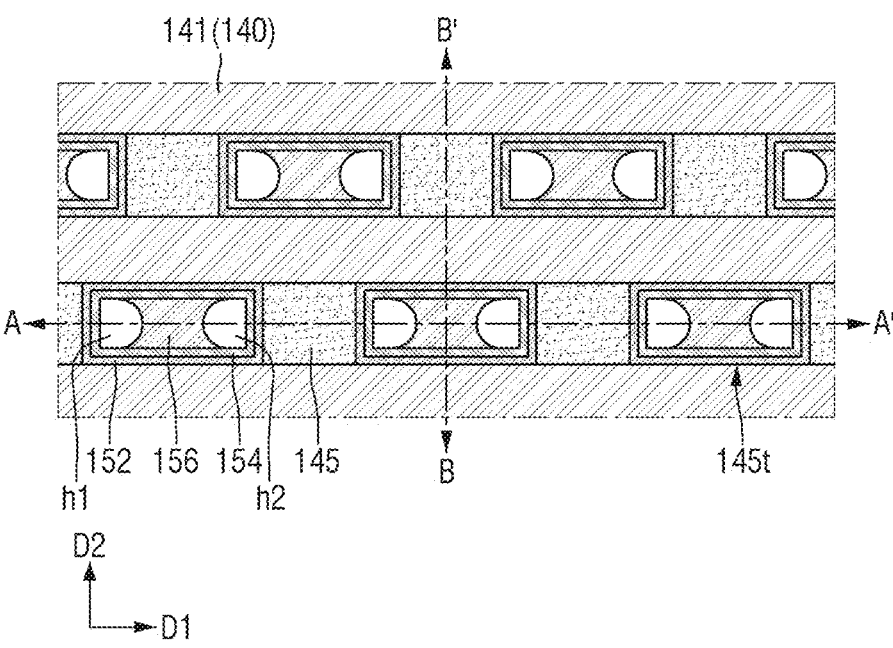
Figure 25:
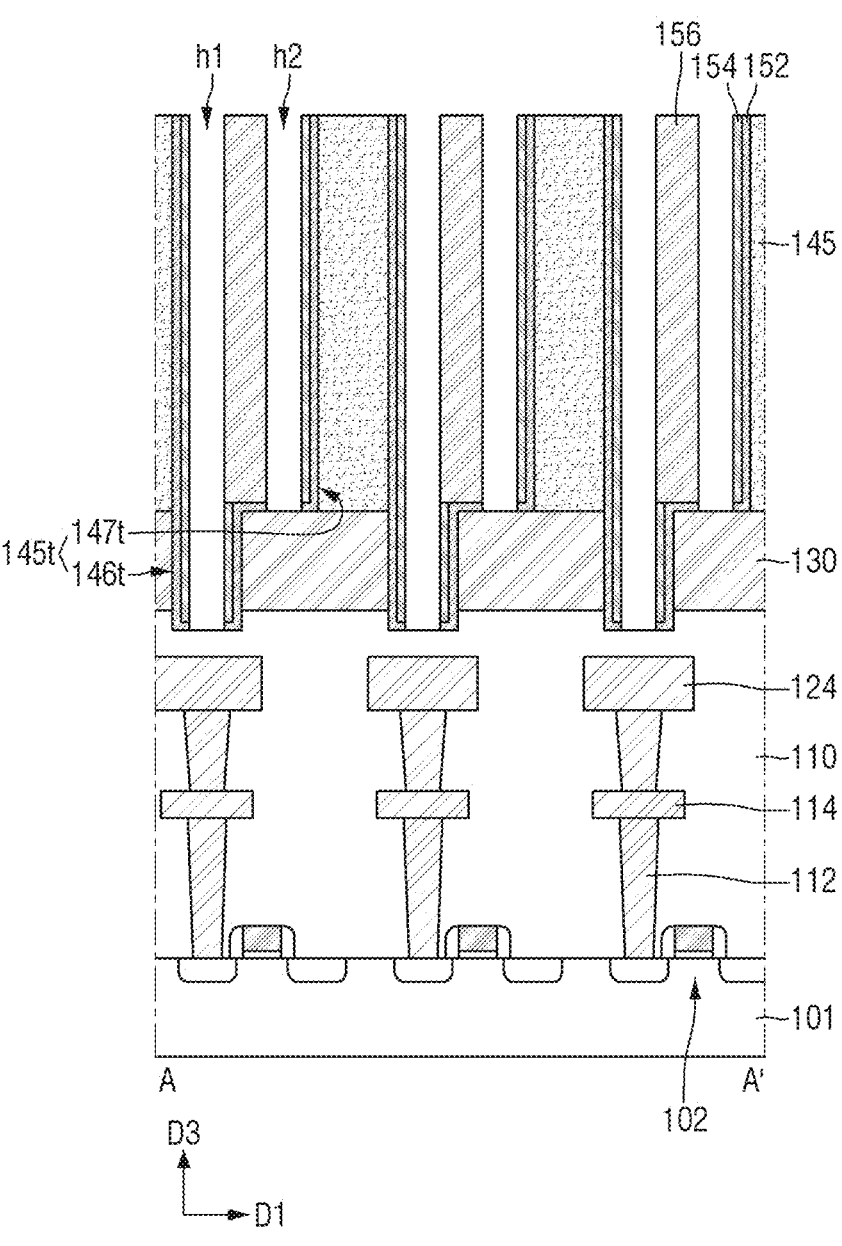
Figure 26:
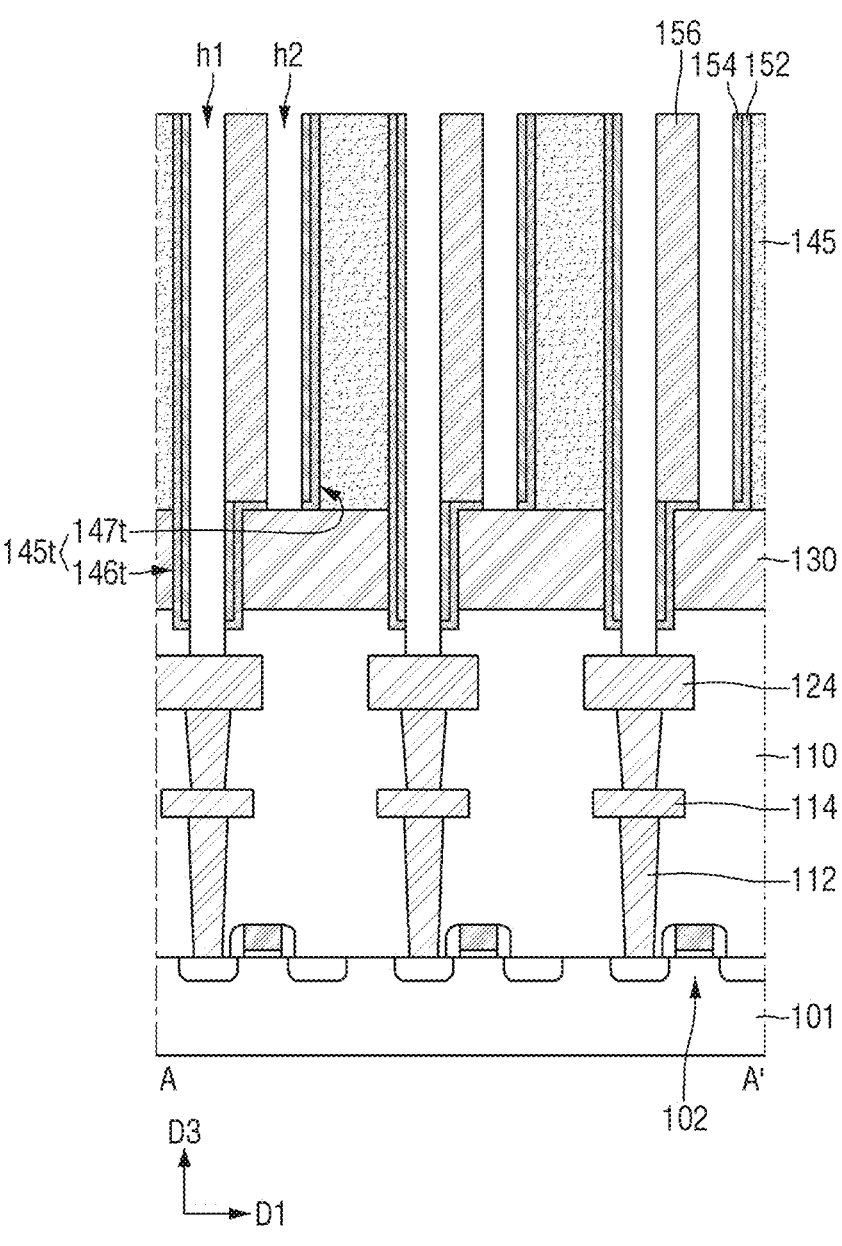

Referring to FIGS. 24 and 25, a first hole h1 and a second hole h2 may be formed in the isolation layer 156. The first hole h1 may be formed in the first part 146*t*, and the second hole h2 may be formed in the second part 147*t*. The first hole h1 and the second hole h2 may expose the ferroelectric layer 152.

Thereafter, the ferroelectric layer 152 exposed through the first hole h1 and the second hole h2 may be removed. Accordingly, the first hole h1 may expose the first interlayer insulating layer 110, and the second hole h2 may expose the common source plate 130. In some example embodiments, the ferroelectric layer 152 may be etched by a dry etching process.

Referring to FIG. 26, a portion of the first interlayer insulating layer 110 may be etched through the first hole h1. That is, the first hole h1 may expose the first interconnection 124.

Then, referring to FIGS. 26 and 3 to 5, a first conductive pillar 161 to be filled in the first hole h1 and a second conductive pillar 162 to be filled in the second hole h2 may be formed. Accordingly, the first conductive pillar 161 may be electrically connected to the first interconnection 124, and the second conductive pillar 162 may be electrically connected to the common source plate 130.

Thereafter, a second interlayer insulating layer 210 including a second via 212 and a second interconnection 214 may be formed on the stack 140, the separation plug 145, the first and second conductive pillars 161 and 162, and the isolation layer 156. The second conductive pillar 162 may be electrically connected to the second interconnection 214 through the second via 212.

Figure 27:
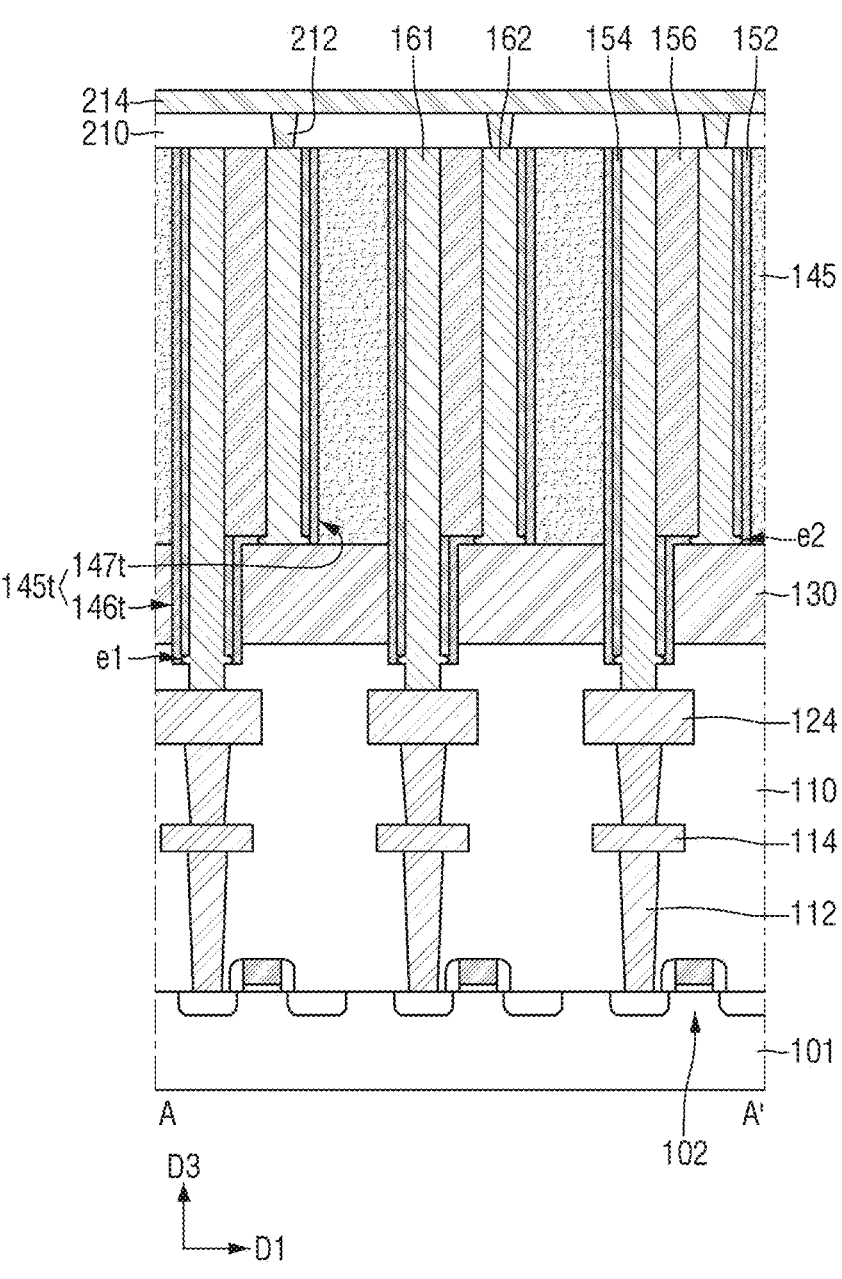
FIG. 27 is a view of a semiconductor device according to some example embodiments.

FIG. 27 is a view of a semiconductor device according to some example embodiments. For reference, FIG. 27 is a cross-sectional view taken along line A-A' of FIG. 3. For convenience of description, a description of the same content as that described with reference to FIGS. 1 to 5 may be omitted.

Referring to FIG. 27, in a semiconductor device according to some example embodiments, a first conductive pillar 161 may include a first extension portion e1 recessed into a ferroelectric layer 152, and a second conductive pillar 162 may include a second extension portion e2 recessed into the ferroelectric layer 152.

For example, the first extension portion e1 and the second extension portion e2 may be convex toward the ferroelectric layer 152. The first extension portion e1 may be located at a lowermost end of the ferroelectric layer 152 on a first part 146*t*. The second extension portion e2 may be located at a lowermost end of the ferroelectric layer 152 on a second part 147*t*. The second extension portion e2 may be located at a lowermost end of the second conductive pillar 162.

Figure 28:
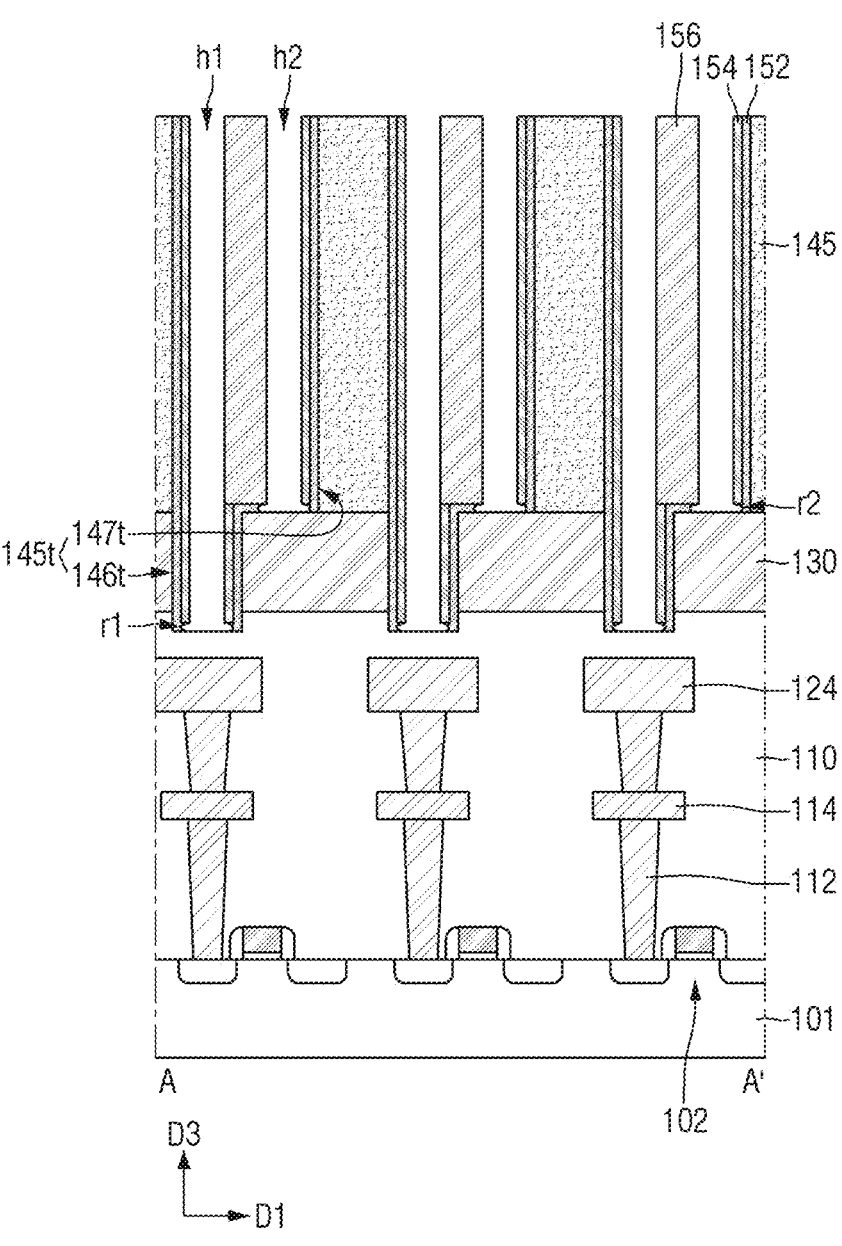
FIG. 28 is a view illustrating an intermediate stage of manufacture, provided to explain a method of manufacturing a semiconductor device according to some example embodiments.

FIG. 28 is a view illustrating an intermediate stage of manufacture, provided to explain a method of manufacturing a semiconductor device according to some example embodiments. For reference, FIG. 28 may illustrate a stage following the stages of the manufacturing method described with reference to FIGS. 9 to 23. FIG. 28 is a cross-sectional view taken along line A-A' of FIG. 24. For convenience of description, a description of the same content as that described with reference to FIGS. 1 to 5 may be omitted.

Referring to FIG. 28, a first hole h1 and a second hole h2 may be formed in the isolation layer 156. Thereafter, the ferroelectric layer 152 exposed through the first hole h1 and the second hole h2 may be removed.

In some example embodiments, the ferroelectric layer 152 may be etched by a wet etching process. As a result, the first hole h1 may include a first recess r1, and the second hole h2 may include a second recess r2.

For example, the first recess r1 and the second recess r2 may be convex toward the ferroelectric layer 152. A distance between the first recesses r1 in the first direction D1 may increase and then decrease as the distance from the substrate 101 increases.

Then, referring to FIGS. 28 and 27, a portion of the first interlayer insulating layer 110 may be etched through the first hole h1 to expose the first interconnection 124.

Thereafter, a first conductive pillar 161 to be filled in the first hole h1 and a second conductive pillar 162 to be filled in the second hole h2 may be formed. The first conductive pillar 161 may include a first extension portion e1 to be filled in the first recess r1, and the second conductive pillar 162 may include a second extension portion e2 to be filled in the second recess r2.

Figure 29:
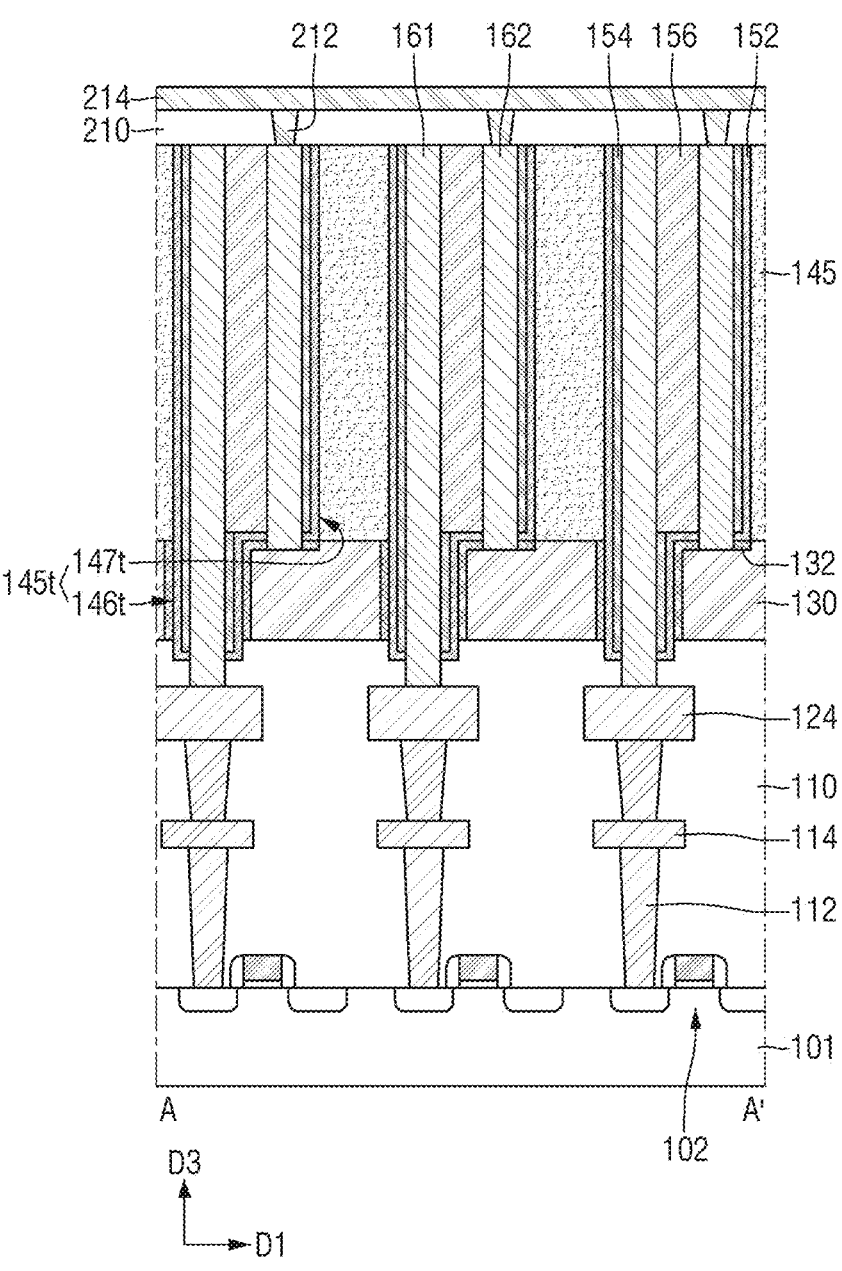
FIGS. 29 and 30 are views of a semiconductor device according to some example embodiments.
Figure 30:
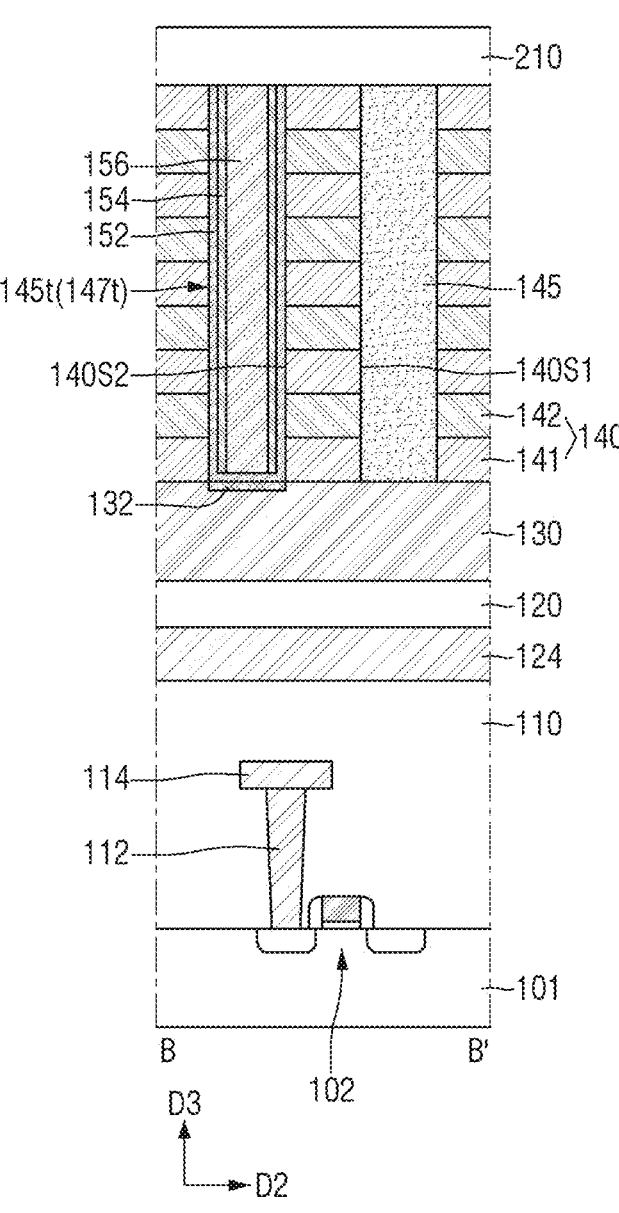

FIGS. 29 and 30 are views of a semiconductor device according to some example embodiments. For reference, FIG. 29 is a cross-sectional view taken along line A-A' of FIG. 3. FIG. 30 is a cross-sectional view taken along line B-B' of FIG. 3. For convenience of description, a description of the same content as that described with reference to FIGS. 1 to 5 may be omitted.

Referring to FIGS. 29 and 30, a semiconductor device according to some example embodiments may further include a protective layer 132. The protective layer 132 may be disposed between the common source plate 130 and the ferroelectric layer 152. The protective layer 132 may include, for example, silicon oxide, but is not limited thereto.

A bottom surface of the second conductive pillar 162 may be disposed in the common source plate 130. The second conductive pillar 162 may be in contact with the common source plate 130.

Figure 31:
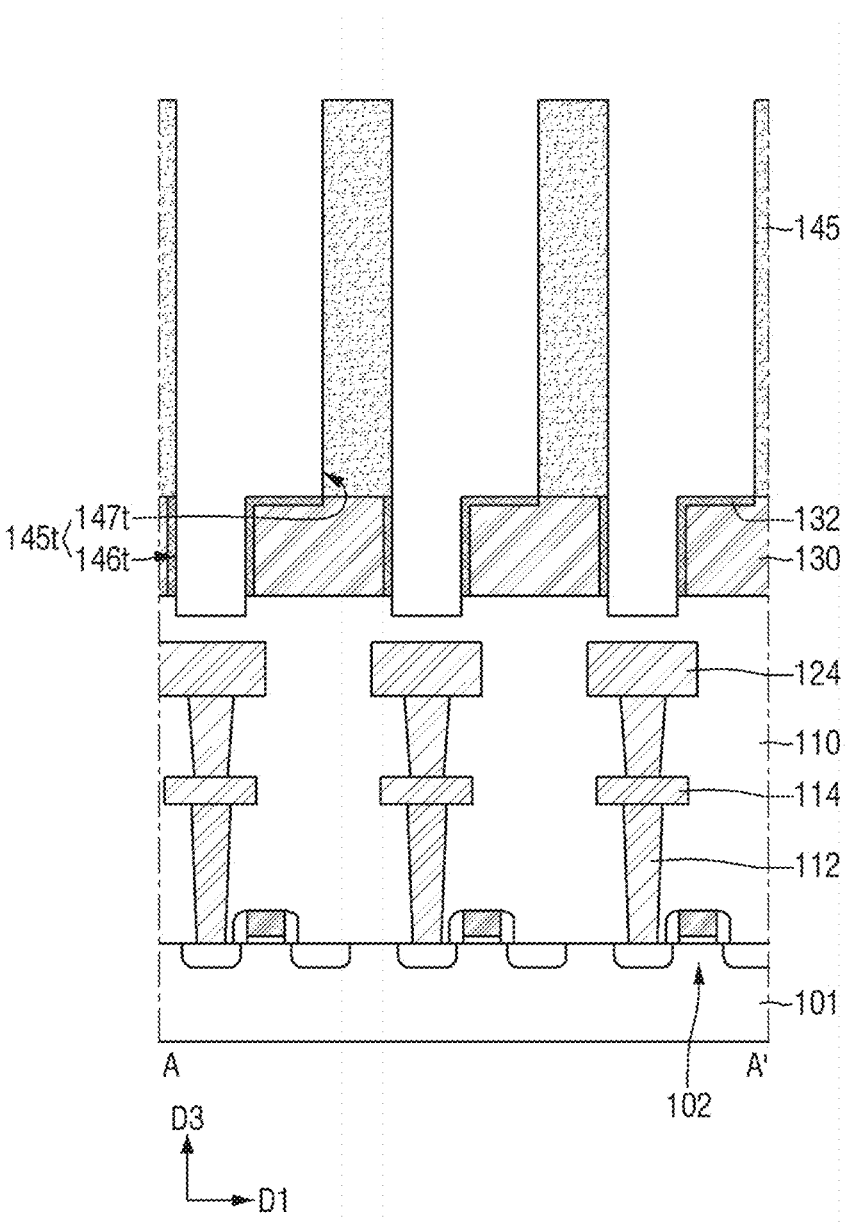
FIGS. 31 and 32 are views illustrating intermediate stages of manufacture, provided to explain a method of manufacturing a semiconductor device according to some example embodiments.
Figure 32:
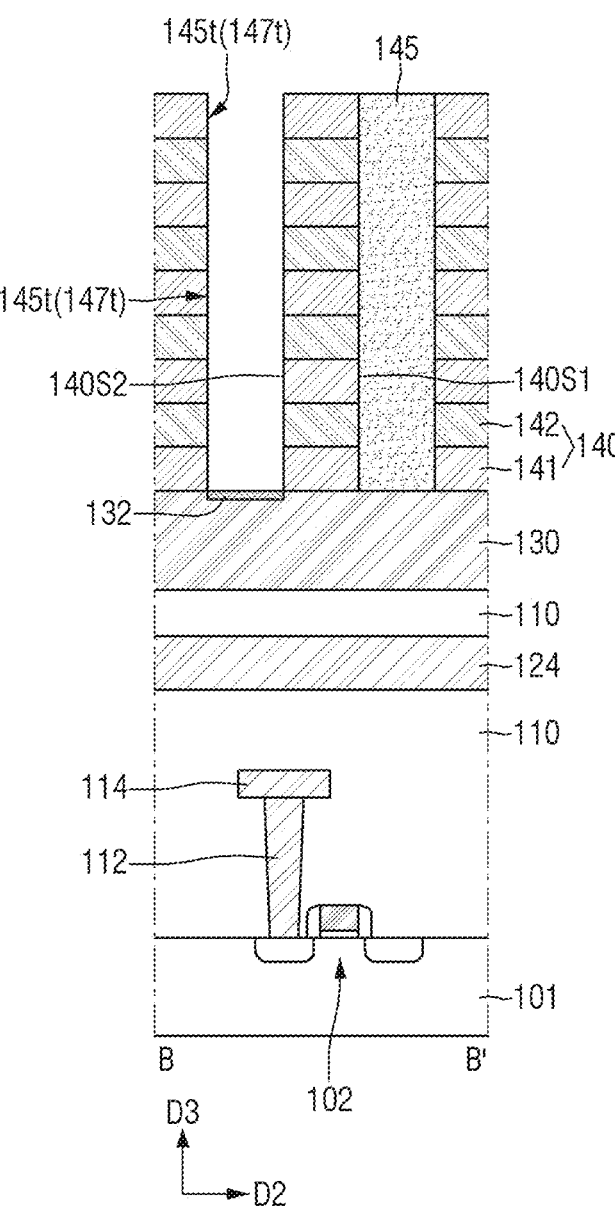

FIGS. 31 and 32 are views illustrating intermediate stages of manufacture, provided to explain a method of manufacturing a semiconductor device according to some example embodiments. For reference, FIGS. 31 and 32 may illustrate stages following the stages of the manufacturing method described with reference to FIGS. 9 to 23. FIGS. 31 and 32 are cross-sectional views taken along line A-A' of FIG. 15. For convenience of description, a description of the same content as that described with reference to FIGS. 1 to 5 may be omitted.

Referring to FIGS. 31 and 32, a protective layer 132 may be formed. The protective layer 132 may be formed by a process of oxidizing the common source plate 130 exposed by the trench 145*t*.

Thereafter, the manufacturing method described with reference to FIGS. 18 to 26 may be performed. In the process of exposing the first interconnection 124 by etching the first interlayer insulating layer 110 through the first hole h1 described with reference to FIG. 26, the protective layer 132 may be removed through the second hole h2. The second hole h2 may expose the common source plate 130.

Thereafter, referring to FIGS. 29 and 30, a first conductive pillar 161 electrically connected to the first interconnection 124 and a second conductive pillar 162 electrically connected to the common source plate 130 may be formed.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While the present disclosure has been particularly shown and described with reference to example embodiments thereof and using specific terms, these example embodiments are provided so that this disclosure will fully convey the concept of the present disclosure, and not for purposes of limitation. Thus, it will be obvious to one of ordinary skill in the art that various changes and other equivalents may be made therein. Therefore, the scope of the present disclosure is defined not by the detailed description of the present disclosure but by the appended claims.

What is claimed:

1. A semiconductor device comprising:
a substrate;

a first interlayer insulating layer, on the substrate, comprising a first interconnection;
a common source plate on the first interlayer insulating layer;
a conductive layer extending in a first direction on the common source plate;
a ferroelectric layer on one sidewall of the conductive layer;
a channel layer on the ferroelectric layer;
a first conductive pillar, on the channel layer, penetrating the common source plate and being connected to the first interconnection; and
a second conductive pillar, on the channel layer, spaced apart from the first conductive pillar in the first direction and connected to the common source plate,
the ferroelectric layer and the channel layer between the common source plate and the first conductive pillar.

2. The semiconductor device of claim 1, wherein the first conductive pillar is convex toward the second conductive pillar and the second conductive pillar is convex toward the first conductive pillar.

3. The semiconductor device of claim 1, wherein a maximum width of the first conductive pillar on the substrate is equal to a maximum width of the second conductive pillar on the substrate.

4. The semiconductor device of claim 1, further comprising:
a second via on the second conductive pillar; and
a second interconnection on the second via.

5. The semiconductor device of claim 1, further comprising a protective layer between the ferroelectric layer and the common source plate.

6. The semiconductor device of claim 1, wherein
the first conductive pillar comprises a first extension portion convex toward the ferroelectric layer and
the second conductive pillar comprises a second extension portion convex toward the ferroelectric layer.

7. The semiconductor device of claim 1, wherein a sidewall of the first conductive pillar has a step.

8. The semiconductor device of claim 1, wherein the ferroelectric layer comprises a first layer and a second layer that is different from the first layer.

9. A semiconductor device comprising:
a substrate;
a first interlayer insulating layer, on the substrate, comprising a first via and a first interconnection;
a common source plate on the first interlayer insulating layer;
a plurality of stacks, on the common source plate, extending in a first direction and being arranged in a second direction, and each of the plurality of stacks comprising insulating layers and conductive layers that are alternately stacked in a third direction;
a plurality of separation plugs between the plurality of stacks;
a trench configured to separate the plurality of separation plugs and comprising a first part that penetrates the common source plate, and a second part that does not penetrate the common source plate;
a ferroelectric layer extending along the trench;
a channel layer on the ferroelectric layer;
a bit line, on the channel layer in the first part, extending in the third direction and being connected to the first interconnection;
a source line, on the channel layer in the second part, extending in the third direction and being connected to the common source plate; and an isolation layer in the trench between the bit line and the source line.

10. The semiconductor device of claim 9, wherein separation plugs neighboring in the second direction among the plurality of separation plugs overlap each other in the second direction.

11. The semiconductor device of claim 9, wherein separation plugs neighboring in the second direction among the plurality of separation plugs do not overlap each other in the second direction.

12. The semiconductor device of claim 9, wherein the bit line is in contact with the first interconnection and the source line is in contact with the common source plate.

13. The semiconductor device of claim 9, further comprising a second interlayer insulating layer, on the plurality of stacks, comprising a second interconnection and a second via, wherein the second via is connected to the source line.

14. The semiconductor device of claim 9, wherein the source line is convex toward the bit line and the bit line is convex toward the source line.

15. The semiconductor device of claim 9, further comprising a protective layer between the ferroelectric layer and the common source plate.

16. The semiconductor device of claim 15, wherein a lower surface of the source line is on the common source plate.

17. The semiconductor device of claim 9, wherein the bit line comprises a first extension portion recessed into the ferroelectric layer and the source line comprises a second extension portion recessed into the ferroelectric layer.

18. The semiconductor device of claim 9, wherein the channel layer is not between the isolation layer and the ferroelectric layer.

19. A semiconductor device comprising:
a substrate;
a first interlayer insulating layer, on the substrate, comprising a first interconnection;
a common source plate on the first interlayer insulating layer;
a stack, on the common source plate, extending in a first direction and comprising insulating layers and conductive layers that are alternately stacked;
a ferroelectric layer on one sidewall of the conductive layer;
a channel layer on the ferroelectric layer; and
a plurality of first conductive pillars and a plurality of second conductive pillars, on the channel layer, extending in a vertical direction and being alternately arranged in the first direction,
the plurality of first conductive pillars penetrating the common source plate and being connected to the first interconnection,
the plurality of second conductive pillars connecting to the common source plate, and
the ferroelectric layer and the channel layer between the common source plate and the first conductive pillars.

20. The semiconductor device of claim 19, wherein a lower surface of the ferroelectric layer on the substrate is located below a lower surface of the common source plate on the substrate.

* * * * *